(12) United States Patent
Oh et al.

(10) Patent No.: US 7,223,649 B2
(45) Date of Patent: May 29, 2007

(54) METHOD OF FABRICATING TRANSISTOR OF DRAM SEMICONDUCTOR DEVICE

(75) Inventors: Yong-Chul Oh, Gyeonggi-do (KR); Wook-Je Kim, Gyeonggi-do (KR); Nak-Jin Son, Gyeonggi-do (KR); Se-Myeong Jang, Gyeonggi-do (KR); Gyo-Young Jin, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 210 days.

(21) Appl. No.: 10/922,055

(22) Filed: Aug. 18, 2004

(65) Prior Publication Data

US 2005/0042832 A1    Feb. 24, 2005

(30) Foreign Application Priority Data

Aug. 21, 2003  (KR)  ............... 10-2003-0057836

(51) Int. Cl.
*H01L 21/336* (2006.01)
*H01L 21/8238* (2006.01)
*H01L 21/8242* (2006.01)

(52) U.S. Cl. ............ 438/216; 438/231; 438/287; 438/305; 438/491; 438/532; 438/591

(58) Field of Classification Search ............... 438/491
See application file for complete search history.

(56) References Cited

U.S. PATENT DOCUMENTS 6,001,677 A * 12/1999 Shimizu ............ 438/231
6,030,874 A    2/2000 Grider et al.
6,184,110 B1   2/2001 Ono et al.
6,198,121 B1 * 3/2001 Sung ............... 257/296
6,387,784 B1 * 5/2002 Chong et al. ........ 438/585
6,432,780 B2   8/2002 Chen
6,566,281 B1   5/2003 Buchanan et al.
2002/0001899 A1 * 1/2002 Ito .................. 438/231
2003/0057499 A1 * 3/2003 Yamamoto .......... 257/369
2003/0092249 A1 * 5/2003 Hsu et al. ........... 438/592

* cited by examiner

*Primary Examiner*—Stephen W. Smoot
(74) *Attorney, Agent, or Firm*—Marger Johnson & McCollom, P.C.

(57) ABSTRACT

Embodiments prevent or substantially reduce diffusion of a P-type impurity into a channel region in a PMOS transistor having a dual gate. Some embodiments include forming a device isolation film on a semiconductor substrate, forming a channel impurity region in an active region of the semiconductor substrate, and forming a gate insulation layer including a silicon oxide layer and a silicon oxide nitride layer on the semiconductor substrate. Also, the embodiments can include forming a polysilicon layer containing an N-type impurity on the gate insulation layer, and forming a gate electrode by selectively ion-implanting a P-type impurity into the polysilicon layer formed in a PMOS transistor region of the circuit region. The embodiments further include forming a conductive metal layer and a gate upper insulation layer on the gate electrode, and forming a gate stack in a gate region.

61 Claims, 20 Drawing Sheets

Amorphous
:Random

LP poly
:columnar

METHOD OF FABRICATING TRANSISTOR OF DRAM SEMICONDUCTOR DEVICE

CROSS REFERENCE TO RELATED APPLICATION

This application claims priority under 35 USC § 119 from Korean Patent Application No. 2003-57836, filed on Aug. 21, 2003, the contents of which are herein incorporated by reference in their entirety for all purposes.

FIELD OF THE INVENTION

The present invention relates to a manufacturing of a DRAM semiconductor device, and more particularly, to a transistor fabricating method capable of substantially reducing or controlling a penetration of impurity such as boron or $BF_2$ in a PMOS transistor of a dual gate.

BACKGROUND OF THE INVENTION

MOS (metal oxide silicon) devices are being made smaller and smaller according to a need for high-integration of semiconductor devices. For example, channel width is being reduced to sub-micron levels to increase the operating speed and current drive capability of semiconductor devices.

In a CMOS (complementary metal oxide silicon) semiconductor device a MOS device is generally used together with an NMOS transistor in which a P channel MOS transistor and an N-channel MOS transistor are formed in one semiconductor device so as to perform a complementary operation. Accordingly dual gates have been used. Dual gates generally reinforce the semiconductor function of a channel surface layer and therefore produce a desired symmetrical low-voltage operation. In fabricating a CMOS semiconductor device employing a dual gate, boron or $BF_2$ is generally used to dope the polysilicon gate electrode of a PMOS transistor.

Unfortunately, when boron has been used as the impurity, it has been likely that the boron would penetrate a thin gate insulation layer and diffuse into the channel during a subsequent annealing process, etc. This diffusion of boron into the channel decreases the mobility of charges in the channel. Also, impurity depletion in the gate electrode may occur and may further form a P-type impurity layer near the channel connecting the source and drain. This results in an increased operating voltage, which of course hinders high integration. Furthermore, the operating voltage becomes unpredictable since boron does not always diffuse into the channel, making high integration even more difficult. This diffusion problem may become even more serious when $BF_2$ is used as the impurity to make a shallower and narrower source/drain because boron is even more likely to diffuse when fluorine reactions are present.

Describing the aforementioned impurity depletion in the gate electrode in more detail, the solubility of solid boron in polysilicon is generally low. Therefore, even if the penetration of boron is high, the boron may not be distributed evenly within the polysilicon gate layer and a depleted region could form in the gate electrode adjacent to the gate insulation layer. If a depletion region forms adjacent to the gate insulation layer, a voltage applied to the gate electrode will not have a sufficient influence upon the channel. Therefore, the formation of a depletion region is another cause of an increase in the threshold voltage.

A conventional method of fabricating a transistor of a DRAM (dynamic random access memory) semiconductor device will be described according to the prior art, referring to FIGS. 1a to 1v.

Referring to FIG. 1a, a pad oxide layer 12, a molding polysilicon layer 14 and a hard mask layer 16 are formed on a semiconductor substrate 10 that is doped with a P-type impurity.

Referring to FIG. 1b, a photoresist is deposited on the hard mask layer 16, and the photoresist is patterned through a photolithography process to expose a portion of the hard mask layer 16. The hard mask layer 16 is selectively etched through the patterning of photoresist to expose the molding polysilicon layer 14, thus defining an active region A.

In FIG. 1c, the molding polysilicon layer 14, the pad oxide layer 12 and the semiconductor substrate 10 are partially removed to form a trench T.

Referring to FIG. 1d, the surface of the exposed molding polysilicon layer 14 and semiconductor substrate 10 is selectively oxidized through a thermal oxide process by using the hard mask layer 16 as an oxide stop mask, and a device isolation film 18 is formed. The substrate is flattened so as to partially expose the semiconductor substrate.

In FIG. 1e, a photoresist 20 is deposited on the semiconductor substrate 10, and the photoresist 20 is partially etched to expose a cell region X of the semiconductor substrate 10. A P-type impurity of a low dose such as boron or $BF_2$ is selectively ion-implanted into the active region of the cell region X by using the photoresist 20 as an ion implantation mask, to form a channel impurity region 22 of low density, and then the photoresist 20 is removed.

With reference to FIG. 1f, the photoresist 20 is deposited on the semiconductor substrate 10, and the photoresist 20 is partially removed to expose an NMOS transistor region N of the circuit region Y of the semiconductor substrate 10. A P-type impurity of a low dose such as boron or $BF_2$ is ion-implanted into the NMOS transistor region of the circuit region Y by using the photoresist 20 as an ion implantation mask to form the channel impurity region 22 of low density, and then the photoresist 20 is removed.

With reference to FIG. 1g, the photoresist 20 is deposited on the semiconductor substrate 10, and the photoresist 20 is partially removed to expose a PMOS transistor region P of the circuit region Y of the semiconductor substrate 10. An N-type impurity of a low dose such as phosphorous or As is ion-implanted into the PMOS transistor region of the circuit region Y by using the photoresist 20 as an ion implantation mask to form the channel impurity region 22 of low density. Then the photoresist 20 is removed.

In FIG. 1h, a gate insulation layer 24 is formed with a predetermined thickness on the semiconductor substrate 10 through the use of a silicon oxide layer subject to a thermal oxide process, and a polysilicon gate electrode 26 is formed on the gate insulation layer 24.

In FIG. 1i, the photoresist 20 is deposited on the substrate, and the photoresist 20 is partially removed to expose the gate electrode 26 of the NMOS transistor region N of the cell region Y and the circuit region X by using the photolithography process. An N-type impurity is implanted into the gate electrode 26 of the NMOS transistor region N of the cell region Y and the circuit region X, and then the photoresist 20 is removed.

In FIG. 1j, the photoresist 20 is deposited on the substrate, and the photoresist 20 is partially removed to expose the gate electrode 26 of the PMOS transistor region P of the circuit region Y by using the photolithography process. A P-type impurity is implanted into the gate electrode 26 of the PMOS transistor region P, and then the photoresist 20 is removed.

In FIG. 1k, a conductive metal layer 28 is formed on the gate electrode 26, and a gate upper insulation layer 30 is formed on the conductive metal layer 28 by using a silicon nitride layer, etc.

Referring to FIG. 1l, the photoresist (not shown) is deposited on the gate upper insulation layer 30, and the photoresist is partially removed through a photolithography process. Next, the gate upper insulation layer 30, the conductive metal layer 28 and the gate electrode 26 are partially removed to expose a portion of the gate insulation layer 24 by using the photoresist as an etch mask, and then the photoresist is removed.

In FIG. 1m, the photoresist 20 is deposited on an entire face of the substrate, and the photoresist 20 is partially removed to expose the cell region X. A N-type impurity of a low dose such as phosphorous or As is ion-implanted into an exposed source/drain region (S/D) by using the photoresist 20 and the upper insulation layer 30 as an ion implantation mask to form a first impurity region 32 of low density, and then the photoresist 20 is removed.

In FIG. 1n, the photoresist 20 is deposited on an entire face of the substrate, and the photoresist 20 is partially removed to expose the NMOS transistor region N of the circuit region Y. An N-type impurity of a low dose such as phosphorous or As is ion-implanted into the S/D by using the photoresist 20 and the upper insulation layer 30 of the circuit region Y as an ion implantation mask to form the first impurity region 32 of low density, and then the photoresist 20 is removed.

In FIG. 1o, the photoresist 20 is deposited on an entire face of the substrate, and the photoresist 20 is partially removed to expose the PMOS transistor region P of the circuit region Y. A P-type impurity of a low dose such as boron or $BF_2$ is ion-implanted into the S/D by using the photoresist 20 and the upper insulation layer 30 as an ion implantation mask to form the first impurity region 32 of low density, and then the photoresist 20 is removed. Subsequently, in order to reduce a lattice defect of the semiconductor substrate 10 generated by the ion implantation, an annealing process of high temperature, e.g. about 800° C., is performed.

With reference to FIG. 1p, a silicon nitride layer is formed on an entire face of the substrate, and a spacer 34 is formed on a sidewall of the gate electrode 26.

In FIG. 1q, the photoresist 20 is deposited on an entire face of the substrate, and the photoresist 20 is partially removed to expose the NMOS transistor region N of the circuit region Y. An N-type impurity of a high dose is ion-implanted by using the photoresist 20, upper insulating layer 30, and the spacer 34 as an ion implantation mask to form a second impurity region 36 of high density, and then the photoresist 20 is removed.

In FIG. 1r, the photoresist 20 is deposited on an entire face of the substrate, and the photoresist 20 is partially removed to expose the PMOS transistor region P of the circuit region Y. A P-type impurity of a high dose is ion-implanted by using the photoresist 20, the upper insulating layer 30, and the spacer 34 as an ion implantation mask to form the second impurity region 36 of high density, and then the photoresist 20 is removed.

In FIG. 1s, an interlayer insulation layer 38 is formed with silicon oxide on the semiconductor substrate 10 and then the interlayer insulation layer 38 is flattened to expose the gate upper insulation layer 30 and the spacer 34 through a chemical mechanical polishing (CMP) or an etch-back.

In FIG. 1t, the photoresist 20 is deposited on the substrate, and the photoresist 20 is partially removed to expose the interlayer insulation layer 38 provided over the S/D of the cell region X. Further, parts of the interlayer insulation layer 38 are removed to expose the gate insulation layer 24 above the S/D by using the photoresist 20 as an etch mask, and then the photoresist 20 is removed.

With reference to FIG. 1u, an N-type impurity of a high dose is ion-implanted by using the interlayer insulation layer 38, the upper insulation layer 30 and the spacer 34 as an ion implantation mask to form the second impurity region 36 of high density in the S/D of the cell region X, and then the photoresist 20 is removed. After the ion-implantation process, the annealing process of high temperature, e.g. about 800° C. is performed.

In FIG. 1v, the gate insulation layer 24 is removed (not shown) from the S/D of the cell region X, and a pad polysilicon layer 40 is formed by using polysilicon containing a conductive impurity on the semiconductor substrate 10. The pad polysilicon layer 40 is flattened through CMP or etch back so as to partially expose the spacer and the upper insulation layer 30. Then, the annealing process of a high temperature is performed, thus reducing possible defects on the surface of the semiconductor substrate 10 comprising the S/D below the pad polysilicon layer 40.

Though not shown in the drawing, an interlayer insulation layer is formed on the pad polysilicon layer 40. Further, the interlayer insulation layer above the source region is removed to form a first contact hole, and a bit line contact is formed to be electrically connected to the pad polysilicon layer 40 through the first contact hole. Then, another interlayer insulation layer is formed on the substrate, and both interlayer insulation layers above the drain region are removed, thus forming a second contact hole. Thereon, a storage electrode electrically connected to the pad polysilicon layer 40 of a cell transistor through the second contact hole, a dielectric layer and a plate electrode are formed sequentially, thereby completing a capacitor of a memory cell.

However, there are problems in the method of fabricating the transistor of semiconductor device according to the prior art. When ion-implanting the P-type impurity into the gate electrode of the PMOS transistor region, the P-type impurity penetrates the gate insulation layer during a subsequent annealing process and diffuses into the channel. This results in a drop in device performance.

Furthermore, ion-implanting impurities into the gate electrode must be performed several times. Thus, the ion-implantation process is complicated, lowering productivity. Embodiments of the invention address these and other limitations in the prior art.

SUMMARY OF THE INVENTION

Example embodiments of the present invention provide a method of fabricating a transistor of a DRAM semiconductor device, to increase a performance of the device by preventing penetration of P-type impurity into a gate insulation layer, the P-type impurity being ion-implanted into a polysilicon layer.

Example embodiments of the present invention provide a method of fabricating a transistor of a DRAM semiconductor device, to increase productivity by reducing the number of convention processes needed to fabricate the DRAM semiconductor. In one embodiment, only a single ion implantation process of P-type impurity into a polysilicon layer of a PMOS transistor region is needed to fabricate the DRAM semiconductor. The process of ion implantating an N-type impurity into a polysilicon layer of an NMOS transistor region can be omitted.

According to one feature of an embodiment of the present invention, a method of fabricating a transistor of a DRAM semiconductor device includes; forming a device isolation film in a semiconductor substrate, ion-implanting a channel adjusting impurity into an active region of a cell region and a circuit region defined by the device isolation film, forming respective channel impurity regions, and forming a gate insulation layer by forming a silicon oxide layer and a silicon oxide nitride layer on the semiconductor substrate.

Optionally another feature of an embodiment of the present invention may be included in the method of fabricating a transistor of a DRAM semiconductor device. This aspect includes forming an N-type impurity-doped polysilicon layer on the gate insulation layer, and forming a gate electrode by selectively ion-implanting a P-type impurity into the polysilicon layer formed in a PMOS transistor region of the circuit region. This option process saves the process of separately ion-implanting an N-type impurity into the gate electrode.

The method further includes forming a conductive metal layer and a gate upper insulation layer on the gate electrode, and removing the gate upper insulation layer, the conductive metal layer and the gate electrode from above a source/drain region, to form a gate stack in a gate region. The method also includes forming a second impurity region in the source/drain region by using the gate stack as an ion implantation mask, forming a spacer on a sidewall of the gate electrode, and forming a third impurity region within the second impurity region by using the spacer and the gate upper insulation layer as an ion implantation mask.

According to another feature of an embodiment of the present invention, a different process is used as a substitute for forming a silicon oxide layer and a silicon oxide nitride layer on the semiconductor substrate. The process includes forming a silicon oxide layer on the semiconductor substrate, and then implanting a nitrogen component into the silicon oxide layer to form a gate insulation layer.

BRIEF DESCRIPTION OF THE DRAWINGS

The above and other features of exemplary embodiment of the present invention will become readily apparent from the description of the exemplary embodiments that follows, with reference to the attached drawing in which.

DETAILED DESCRIPTION OF EXEMPLARY EMBODIMENTS

Hereinafter, example embodiments of the present invention will be described in detail with reference to FIGS. 2 to 6. This invention may be embodied in many different forms and should not be construed as being limited to the example embodiments set forth herein; rather, these example embodiments are provided so that this disclosure is thorough and complete, and conveys the concept of the invention to those skilled in the art. It will be understood that when an element such as a layer, region or substrate is referred to as being "on" or "onto" another element, it can be directly on the other element or intervening elements may also be present. Additionally, the layer, region or substrate could be partially within or partially embedded in the another element. For example, a formation of layers on a semiconductor substrate or other layer in the accompanied drawings can be changed to a direct contacted formation or a formation of a third layer thereon.

Figure 1A:
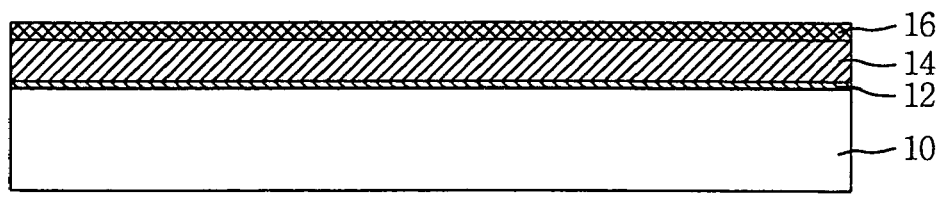
FIGS. 1a to 1v are cross-sectional views illustrating a method of fabricating a DRAM semiconductor device according to the prior art.
Figure 1B:
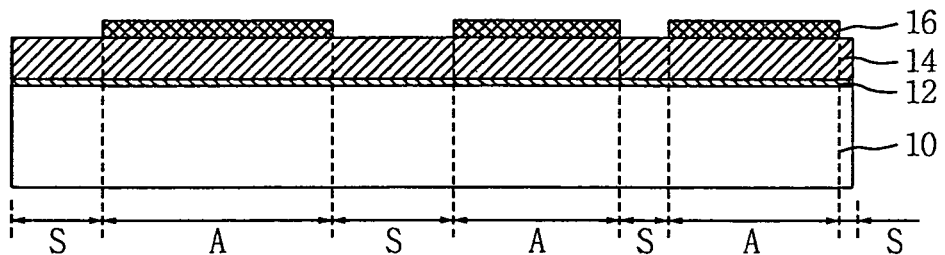
Figure 1C:
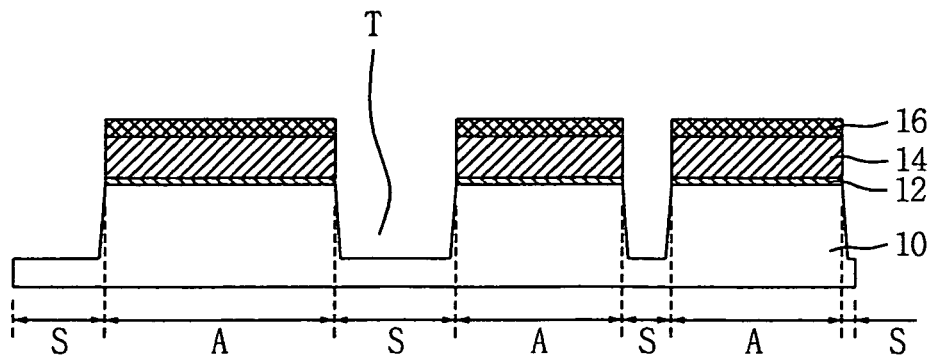
Figure 1D:
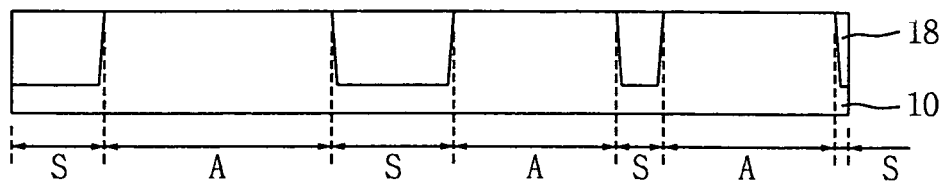
Figure 1E:
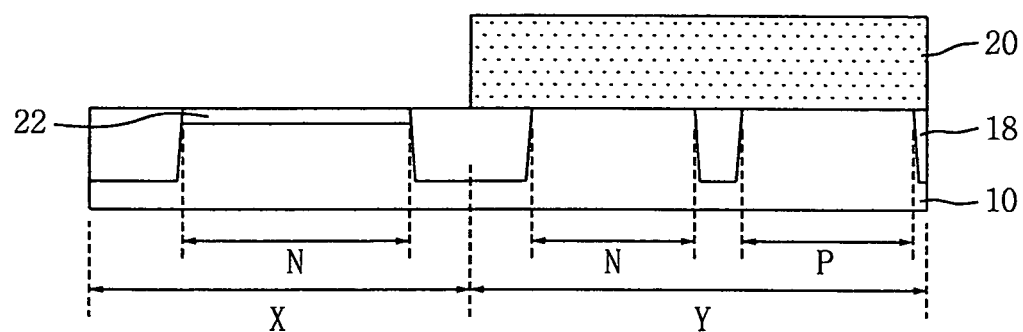
Figure 1F:
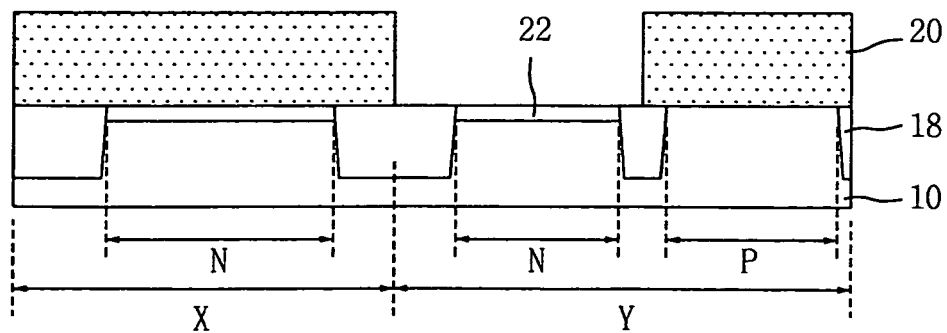
Figure 1G:
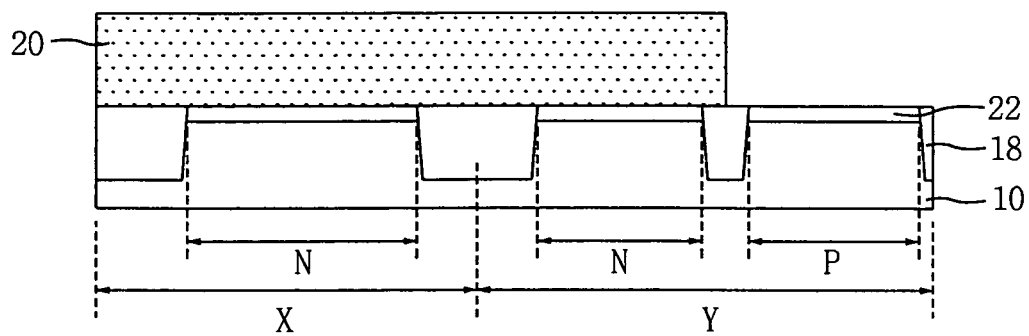
Figure 1H:
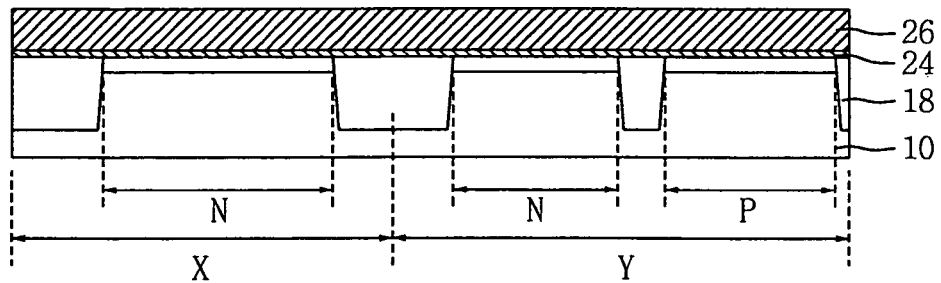
Figure 1I:
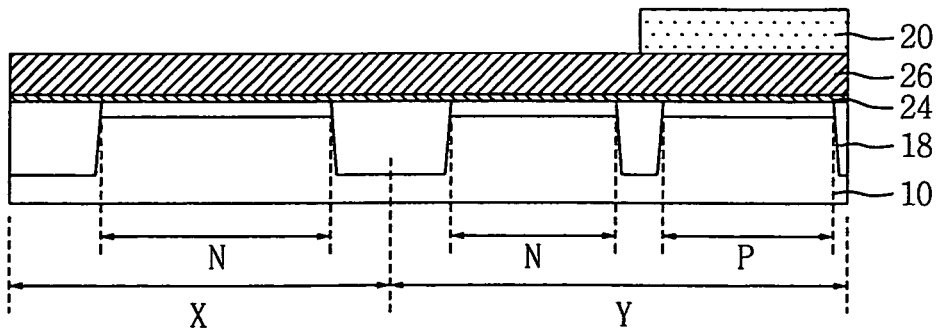
Figure 1J:
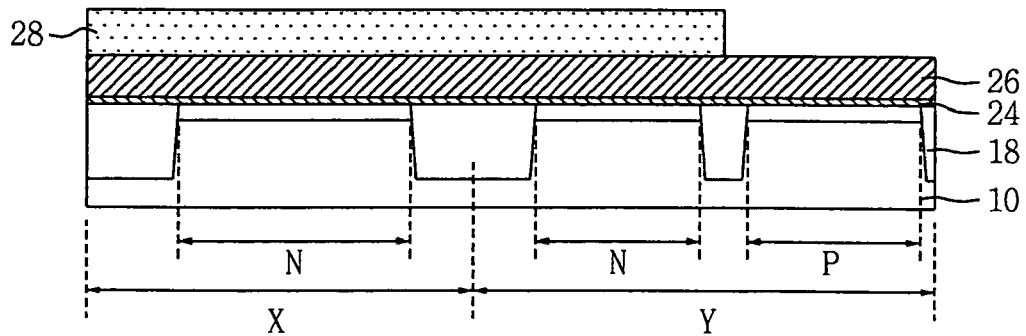
Figure 1K:
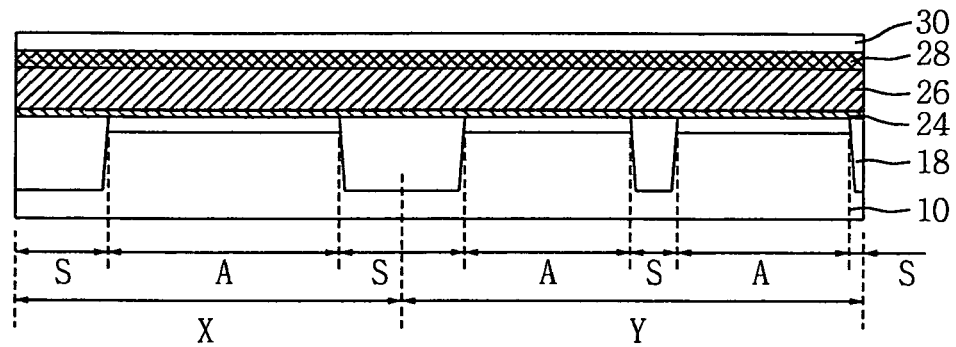
Figure 1L:
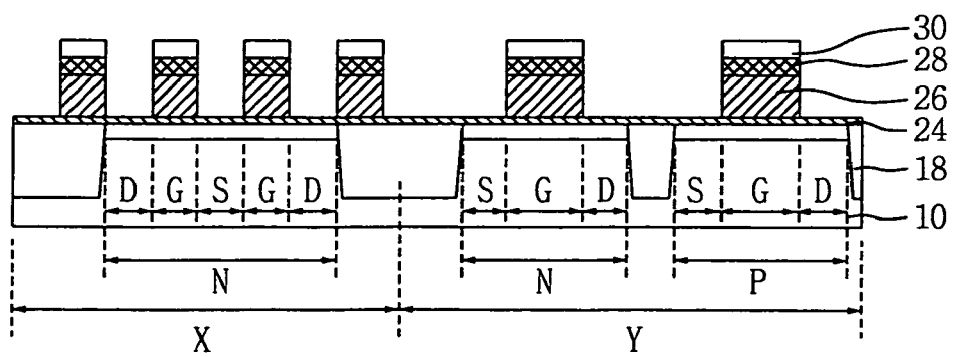
Figure 1M:
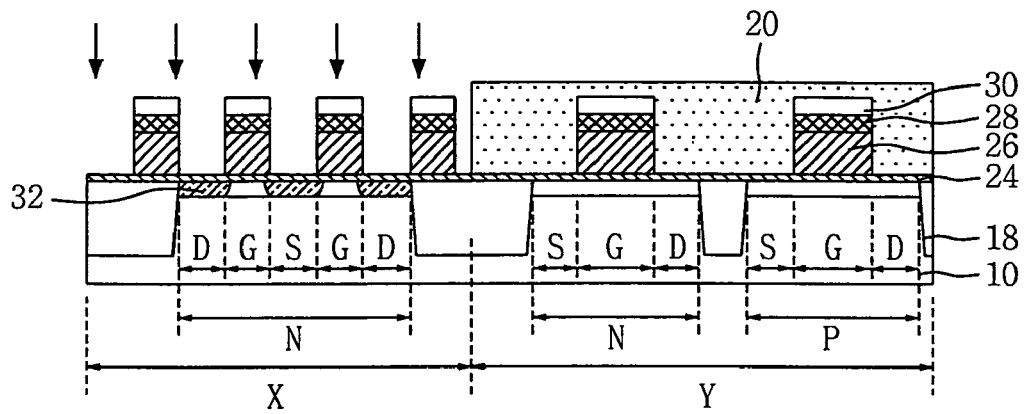
Figure 1N:
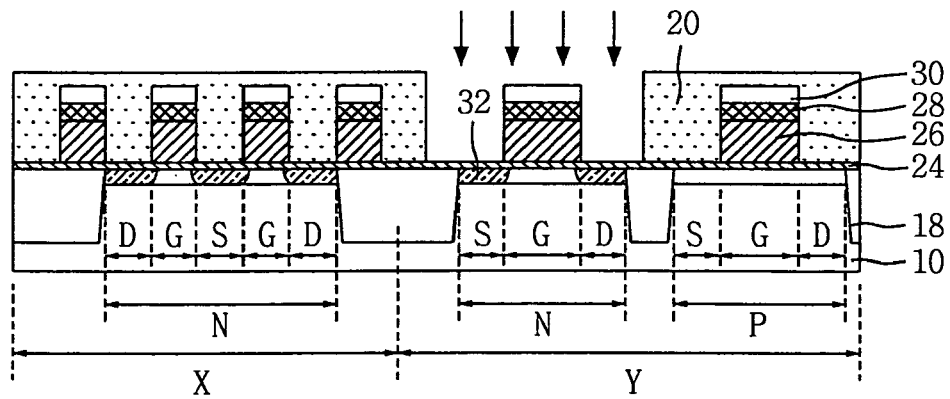
Figure 1O:
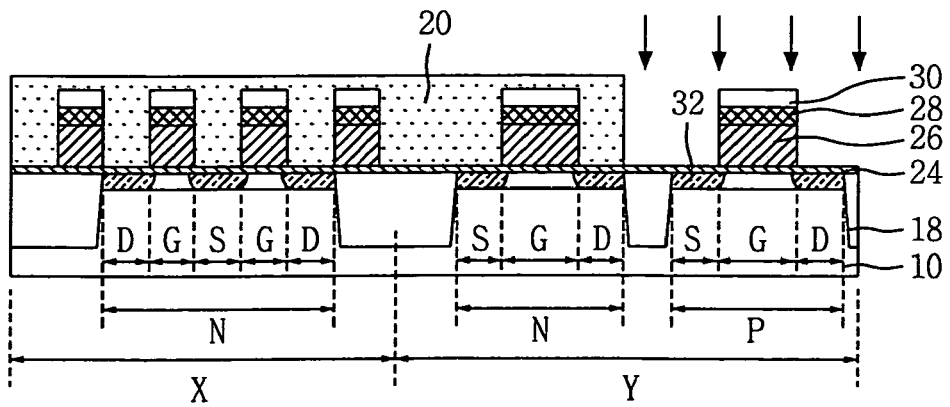
Figure 1P:
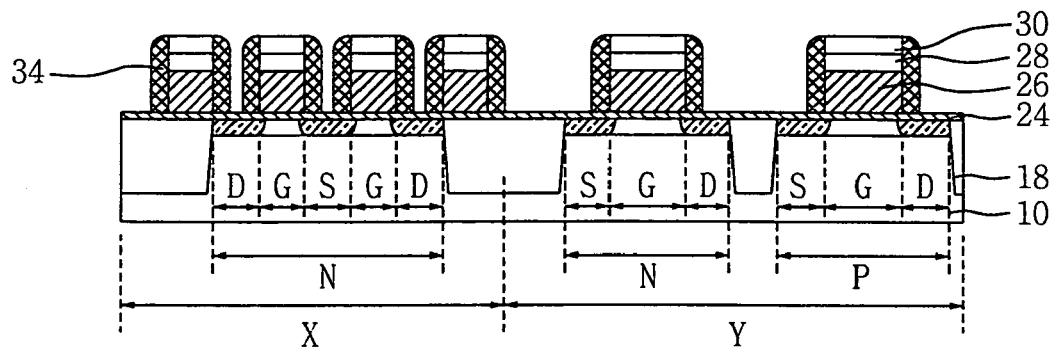
Figure 1Q:
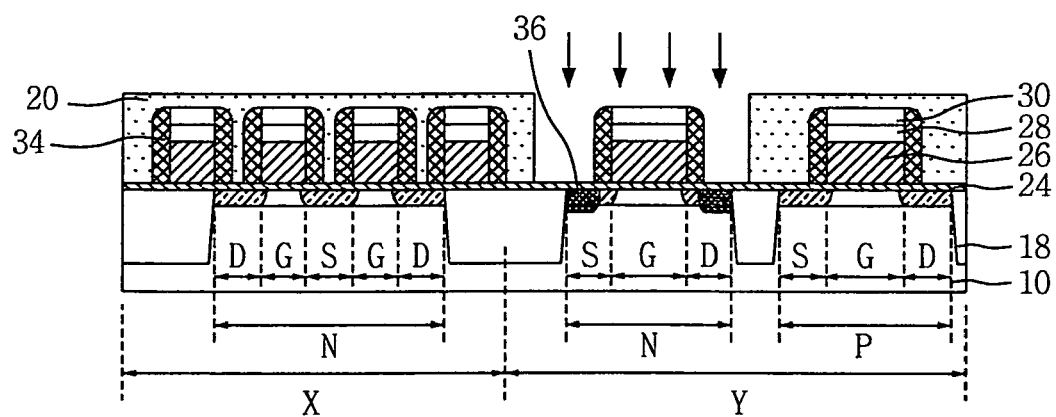
Figure 1R:
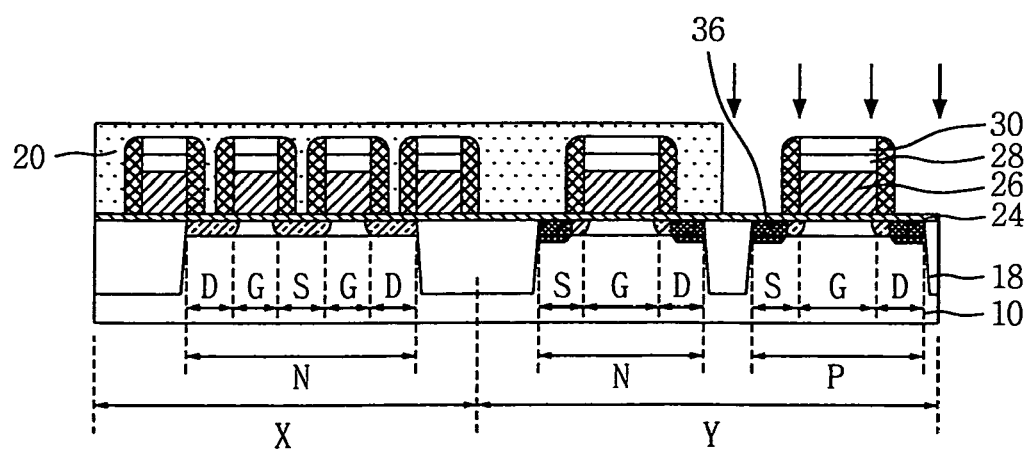
Figure 1S:
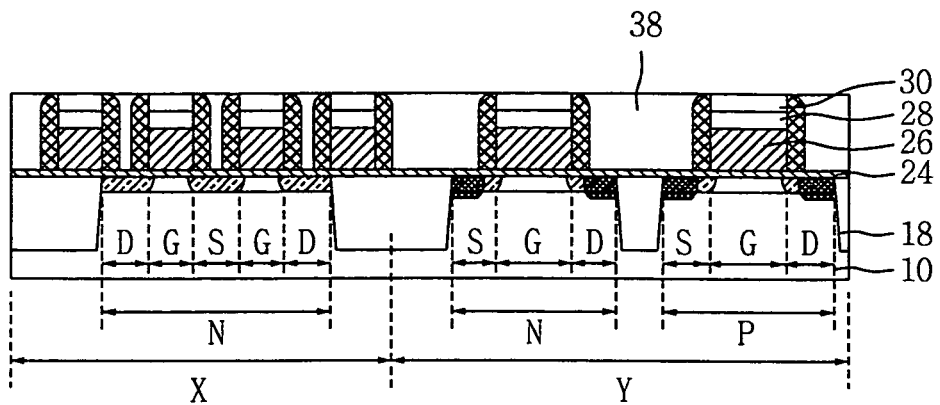
Figure 1T:
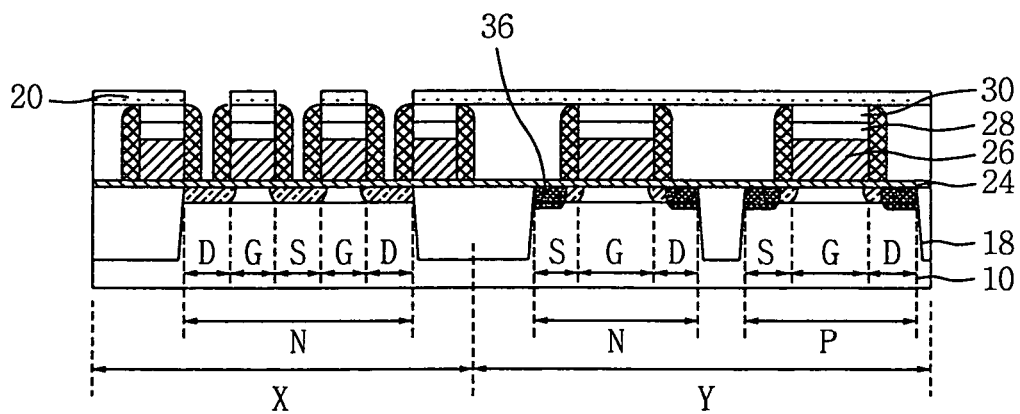
Figure 1U:
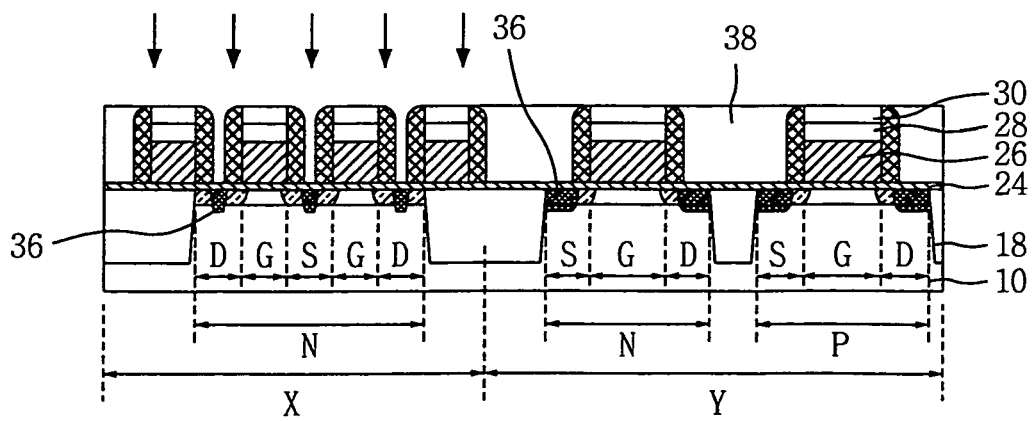
Figure 1V:
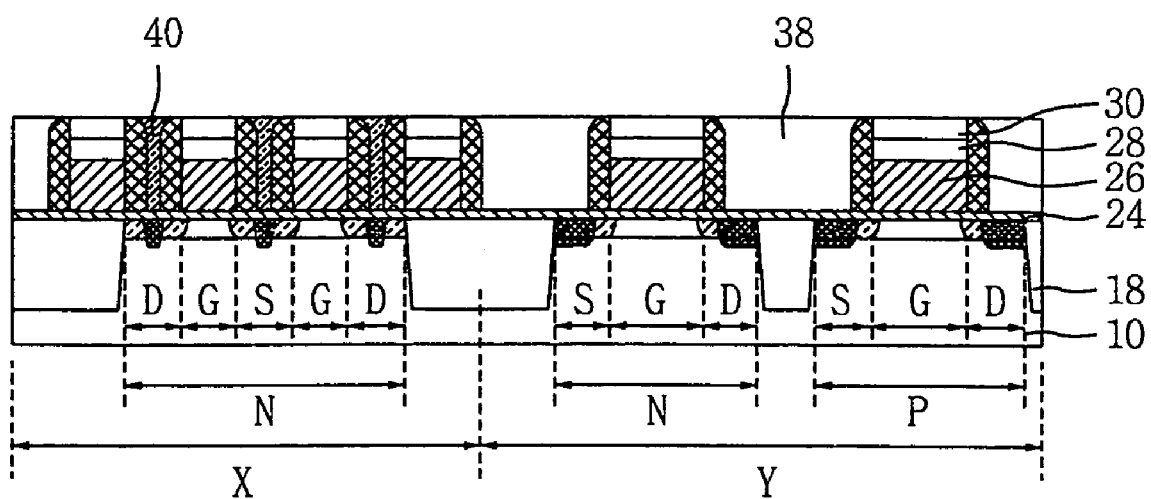
Figure 2A:
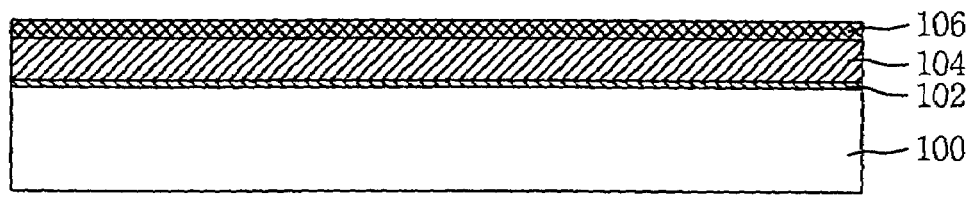
FIGS. 2a to 2v are cross-sectional views illustrating a method of fabricating a DRAM semiconductor device according to an embodiment of the present invention.

Referring first to FIG. 2a, a pad oxide layer 102 is formed on a semiconductor substrate 100 that is doped with a P-type impurity, and then a molding polysilicon layer 104 and a hard mask layer 106 are formed on the pad oxide layer 102. The molding polysilicon layer 104 is formed through chemical vapor deposition (CVD), and the hard mask layer 106 is formed in-situ in the same chamber by using a silicon nitride or a silicon oxide nitride.

Figure 2B:
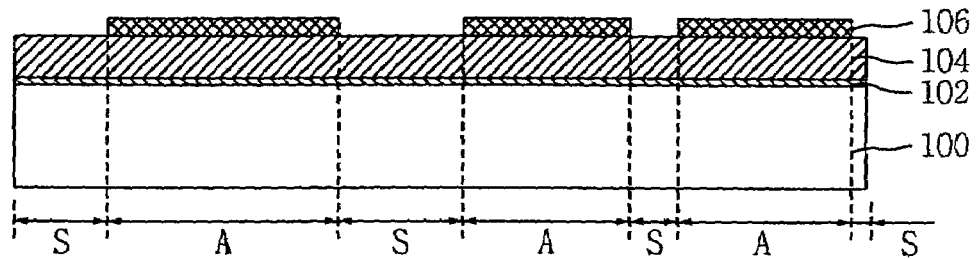

Referring to FIG. 2b, a photoresist (not shown) is deposited on the hard mask layer 106 and is then patterned, and the hard mask layer 106 is selectively etched by using the photoresist as an etch mask to define an active region A. Anisotropic etching may be employed, using the molding polysilicon layer 104 as an etch stop layer.

Figure 2C:
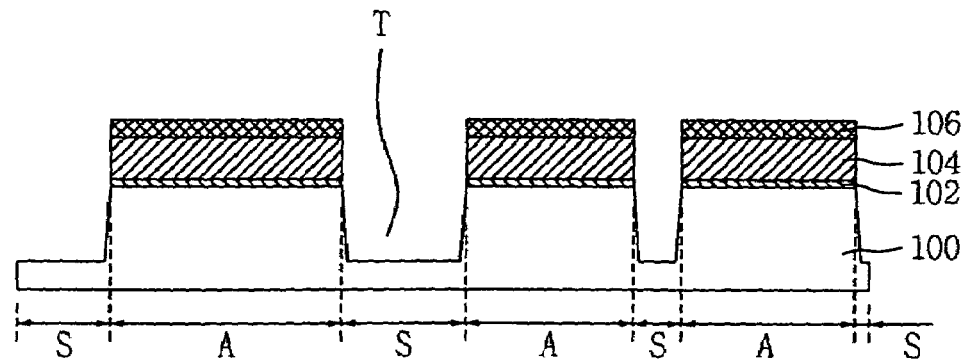

In FIG. 2c, the molding polysilicon layer 104, the pad oxide layer 102 and the semiconductor substrate 100 are partially removed by using the hard mask layer 106 as an etch mask, to thus form a trench T. At this time, the trench T is formed with a predetermined depth, e.g. about 2000 to 5000 Å.

Figure 2D:
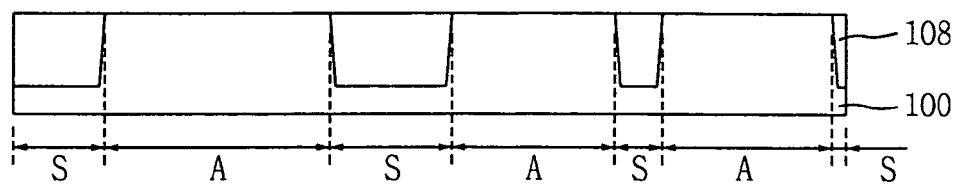

In FIG. 2d, a device isolation film 108 is formed in the trench T. Then the exposed surface of the molding polysilicon layer 104 and the semiconductor substrate 100 is selectively oxidized through a thermal oxide process by using the hard mask layer 106 as an oxide stop mask. The molding polysilicon layer 104 serves as a buffer layer for mitigating stress from volume expansion generated in forming the device isolation film 108. Further, the substrate is flattened through CMP or etch back. This flattening is performed to flatten the surface of the semiconductor substrate 100 by removing the hard mask layer 106, the molding polysilicon layer 104 and the pad oxide layer 102.

Figure 2E:
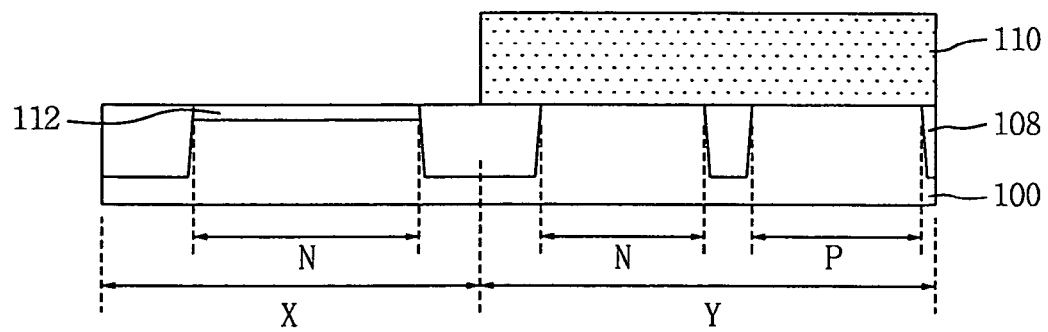

With reference to FIG. 2e, a photoresist 110 is deposited on an entire face of the semiconductor substrate 100, and the photoresist 110 is partially removed to expose a cell region X of the semiconductor substrate 100. A P-type impurity such as boron or $BF_2$ having a low dose, e.g. about $1.0\times10^{13}$ atoms/cm$^3$, is selectively ion-implanted into the cell region X by using the photoresist 110 as an ion implantation mask to form a channel impurity region 112 of low density, e.g. about $1.0\times10^{17}$ atoms/cm$^3$. Then the photoresist 110 is removed. Though not shown in the drawing, a first channel stopper of high density may be formed with a predetermined depth, e.g. under about 2000 Å, from the surface of the semiconductor substrate 100 by ion-implanting a P-type impurity of a high dose into the cell region X of the semiconductor substrate 100 before or after forming the channel impurity region 112. This solves a short-channel effect and prevents a bulk punch-through that is a main cause of the short-channel effect together with a shallow junction.

Figure 2F:
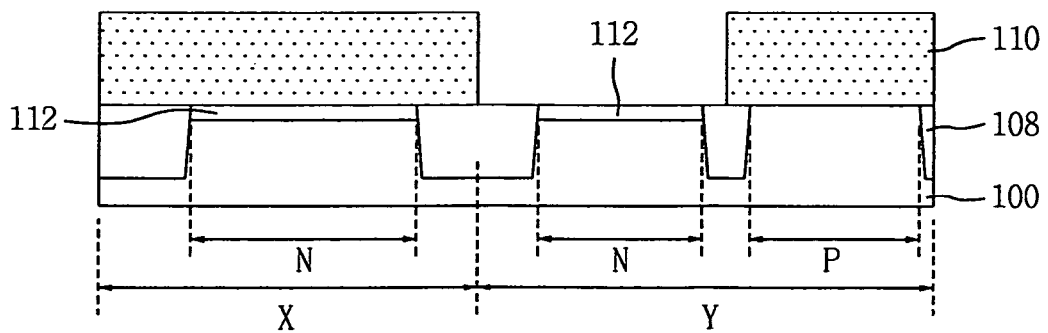

With reference to FIG. 2f, the photoresist 110 is deposited on an entire face of the semiconductor substrate 100, and the photoresist 110 is partially removed to expose an NMOS transistor region N of the circuit region Y through a photolithography process. A P-type impurity such as boron or $BF_2$ having a low dose, e.g. about $1.0 \times 10^{13}$ atoms/cm$^3$, is ion-implanted into the NMOS transistor region N of the circuit region Y by using the photoresist 110 as an ion implantation mask to form the channel impurity region 112 of low density, e.g. about $1.0 \times 10^{17}$ atoms/cm$^3$. Then the photoresist 110 is removed. Though not shown in the drawing, a first channel stopper of high density may be formed with a predetermined depth, e.g. under about 2000 Å from the surface of the semiconductor substrate 100, by ion-implanting a P-type impurity of a high dose into the NMOS transistor region N before or after forming the channel impurity region 112. This solves the short-channel effect and prevents the bulk punch-through that is a main cause of the short-channel effect together with a shallow junction. At this time, the channel impurity region 112 and the first channel stopper may be formed individually or at the same time, in the cell region X and in the NMOS transistor region N of the circuit region Y. Further, the channel adjusting impurity region and the first channel stopper may have different densities to produce different threshold values in the respective transistors.

Figure 2G:
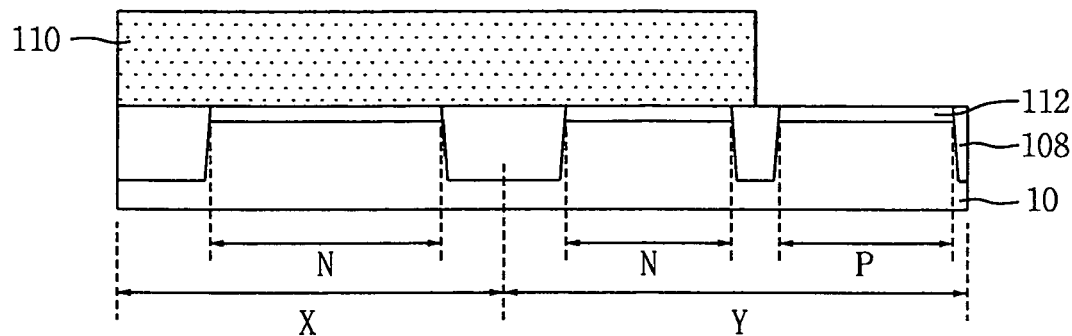

In FIG. 2g, the photoresist 110 is deposited on an entire face of the semiconductor substrate 100, and the photoresist 110 is partially removed to expose a PMOS transistor region P of the circuit region Y of the semiconductor substrate 100. An N-type impurity such as phosphorus or As having a low dose, e.g. about $1.0 \times 10^{13}$ atoms/cm$^3$, is ion-implanted into the PMOS transistor region P of the circuit region Y by using the photoresist 110 as an ion implantation mask, to form the channel impurity region 112 of low density, e.g. about $1.0 \times 10^{17}$ atoms/cm$^3$. Then the photoresist 110 is removed. Though not shown in the drawing, the first channel stopper of high density may be formed with a predetermined depth, e.g. under about 2000 Å from the surface of the semiconductor substrate 100, by ion-implanting an N-type impurity of a high dose into the semiconductor substrate 100 before or after forming the channel impurity region 112. This solves the short-channel effect and prevents a bulk punch-through that is a main cause of the short-channel effect together with the shallow junction.

Figure 2H:
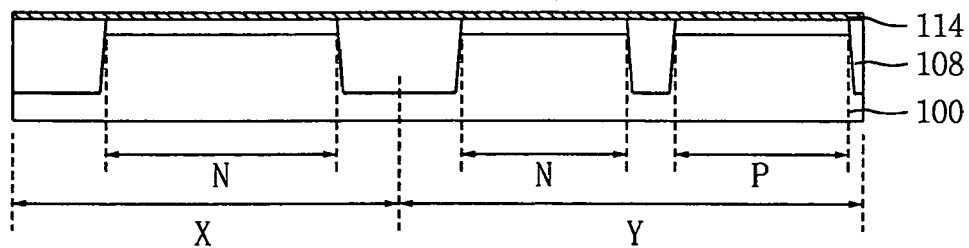

In FIG. 2h, a thermal oxide process is performed on the semiconductor substrate 100 to form a gate insulation layer 114 with a predetermined thickness, e.g. about 25 to 55 Å. The gate insulation layer 114 may be formed by accumulating a silicon oxide layer and a silicon oxide nitride layer, or by implanting a nitrogen ion in a silicon oxide layer after forming a silicon oxide layer. In the later method, a silicon oxide layer is formed on the semiconductor substrate 100 through a thermal oxide process within a sheet fed type process chamber such as a furnace through ISSG (in-situ steam generation) or RTO (rapid thermal oxidation). After the silicon oxide layer is formed over a predetermined thickness, e.g. about 30 to 40 Å, a reactive gas and NO, $NO_2$, or $NH_3$ gas, etc. are implanted into the process chamber. Thus, a thermally nitrided oxide or reoxidized nitrided oxide is formed on the substrate. In other words, a silicon oxide nitride layer is formed on the silicon oxide layer through an atomic-layer-deposited (ALD) Si-nitride/SiO$_2$ stack gate dielectric system (hereinafter, referred to as 'ALD').

Alternatively a decoupled plasma nitridation system (hereinafter, referred to as 'DPN') may be used, the DPN being used in a plasma apparatus that uses a reactive gas involving NO, $NO_2$, or $NH_3$ gas, etc to form this silicon oxide and silicon nitride oxide structure.

Referring back to the ALD method, the silicon oxide layer is formed with about 30 Å on the semiconductor substrate 100, and the process chamber is at about 550 to 650° C. (preferably 595° C.), and DCS ($SiH_2Cl_2$) and $NH_3$ gases are supplied individually and alternately into the process chamber for several seconds to several tens of seconds, e.g. 1 cycle thus forming a silicon oxide nitride layer of a thickness of about 1.0 to 1.4 Å. If the DCS and $NH_3$ gases are individually supplied through 12 cycles, the silicon oxide nitride layer becomes about 12 Å thick in the measured result using a transmission electron microscope (TEM).

Referring now back to the process of forming the silicon oxide nitride layer through DPN, the silicon oxide layer is formed with a thickness of about 45 Å. Next, the semiconductor substrate 100 on which the silicon oxide layer was formed is inserted into a plasma apparatus, where it is exposed below about 100° C. for about 50 to 100 seconds. Next, the pressure within the plasma apparatus is maintained at about 7 to 15 mTorr, a power source of about 500 to 900 W is applied, and nitrogen and oxygen are implanted into the plasma apparatus for about 50 to 150 seconds. Finally to counteract any possible defects caused by a nitrogen component implanted into the silicon oxide layer, a post annealing process of about 850 to 950° C. is performed.

The silicon oxide nitride layer on the silicon oxide layer will prevent penetration of an impurity such as boron or $BF_2$ into the channel when the impurity is being ion-implanted into a gate electrode.

Figure 2I:
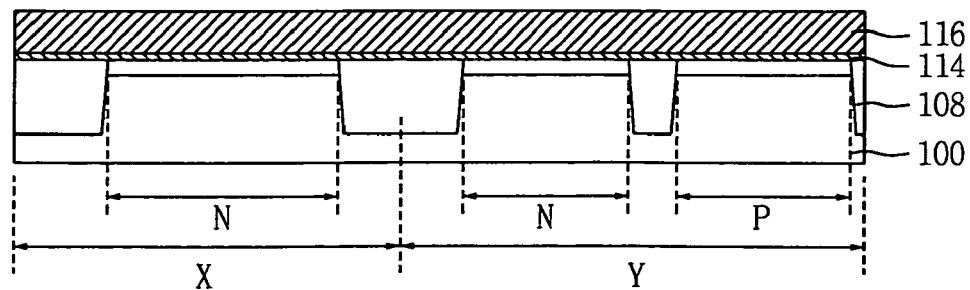

Referring to FIG. 2i, a gate electrode 116 is formed on the gate insulation layer 114 through CVD by using a polysilicon layer doped with an N-type impurity such as phosphorus or As of a high dose, e.g. $1.2 \times 10^{16}$ atoms/cm$^3$. The N-type impurity of the doped polysilicon layer should be selected to avoid a depletion region being formed in the polysilicon layer having a predetermined density, e.g. about $2.0 \times 10^{20}$ atoms/cm$^3$. First, the polysilicon layer is formed through CVD by using sheet fed type deposition equipment. Next, a silicon layer of an amorphous state containing the N-type impurity is formed. Then the substrate is annealed at a predetermined temperature, e.g. about 520 to 550° C., for a predetermined time, e.g. about several tens of minutes, to form a disordered polysilicon layer.

Figure 2J:
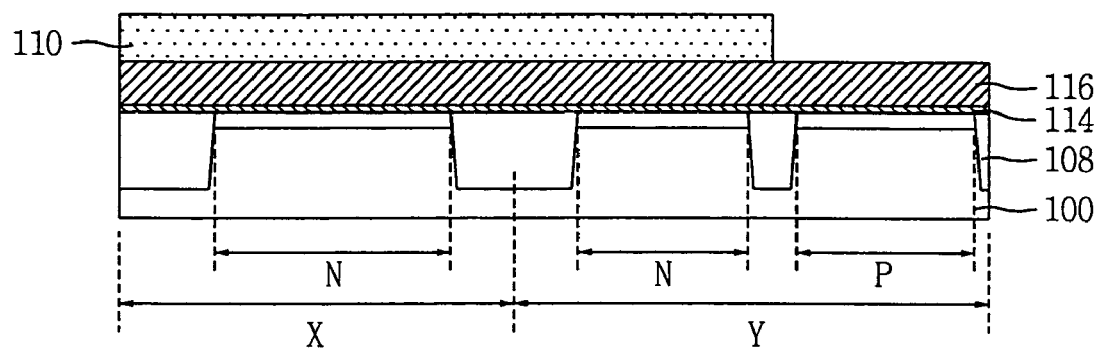

In FIG. 2j, a photoresist 110 is deposited on an entire face of the substrate, and the photoresist is partially removed to expose the gate electrode 116_above the PMOS transistor region P of the circuit region Y. A P-type impurity such as boron or $BF_2$ of a high dose, e.g. about $1.2 \times 10^{16}$ atoms/cm$^3$, is ion-implanted into the gate electrode 116 by using the photoresist as an ion implantation mask to form the gate electrode 116 of a high density, e.g. about $2.0 \times 10^{20}$ atoms/cm$^3$. At this time, the P-type impurity should be selected to avoid depletion of the gate electrode 116. Furthermore, the thickness of the polysilicon layer, the type and dose quantity of the P-type impurity (boron may be used), and the amount of ion implantation energy, etc should be considered. In one embodiment, the thickness of the polysilicon layer is about 300 to 1000 Å (desirably, 800 Å). Further, if $BF_2$ is used as the P-type impurity, ion implantation is performed with about 10 KeV of energy, with a dose of about $1.2 \times 10^{16}$ atoms/cm$^3$. If boron is used, ion implantation is performed with about 2 to 5 KeV (desirably, 3 KeV) of energy with a dose of about $1.2 \times 10^{16}$ atoms/cm$^3$.

Figure 3A:
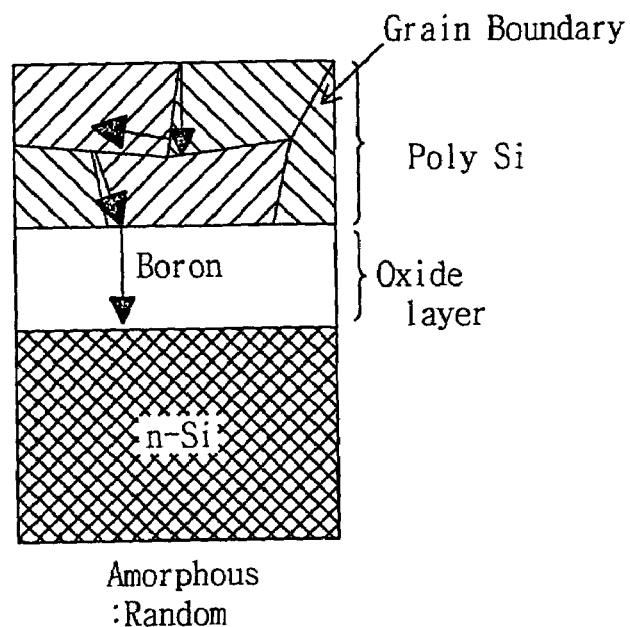
FIGS. 3a to 3b are cross-sectional views comparing a polysilicon layer having an inventive random structure and a polysilicon layer having a conventional column structure.
Figure 3B:
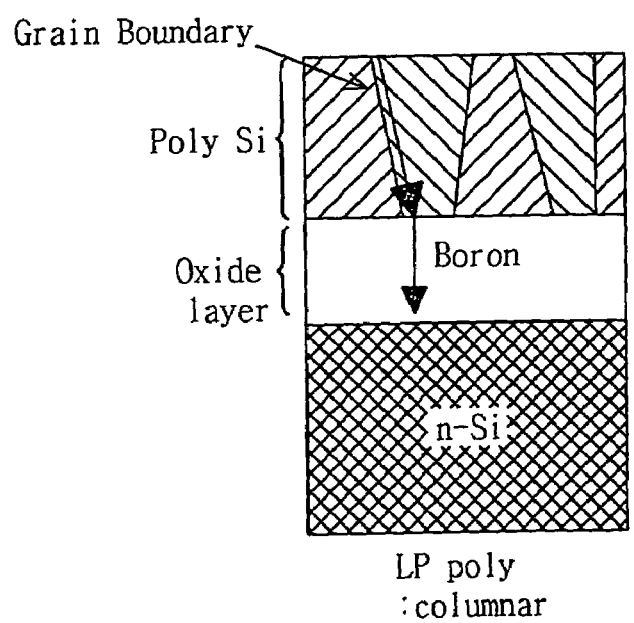

FIG. 3a illustrates polysilicon having a grain boundary of a random structure, while FIG. 3b illustrates polysilicon having a grain boundary of the conventional column structure. The polysilicon having a grain boundary of a random structure based on the present invention acquires the random structure through annealing amorphous silicon to form polysilicon. In contrast, the polysilicon of the conventional column structure acquires the column structure through low-pressure chemical vapor deposition Referring now to FIG. 4, the C-V characteristics of both structures were measured and plotted on a graph. The C-V was measured by applying a ground to the semiconductor substrate 100 doped with the N-type impurity and applying a bias voltage to the polysilicon layer and measuring the capacitance of the gate insulation layer 114. The horizontal axis of FIG. 4 indicates the bias voltage (Vg) normalized for the measured capacitance.

Figure 4:
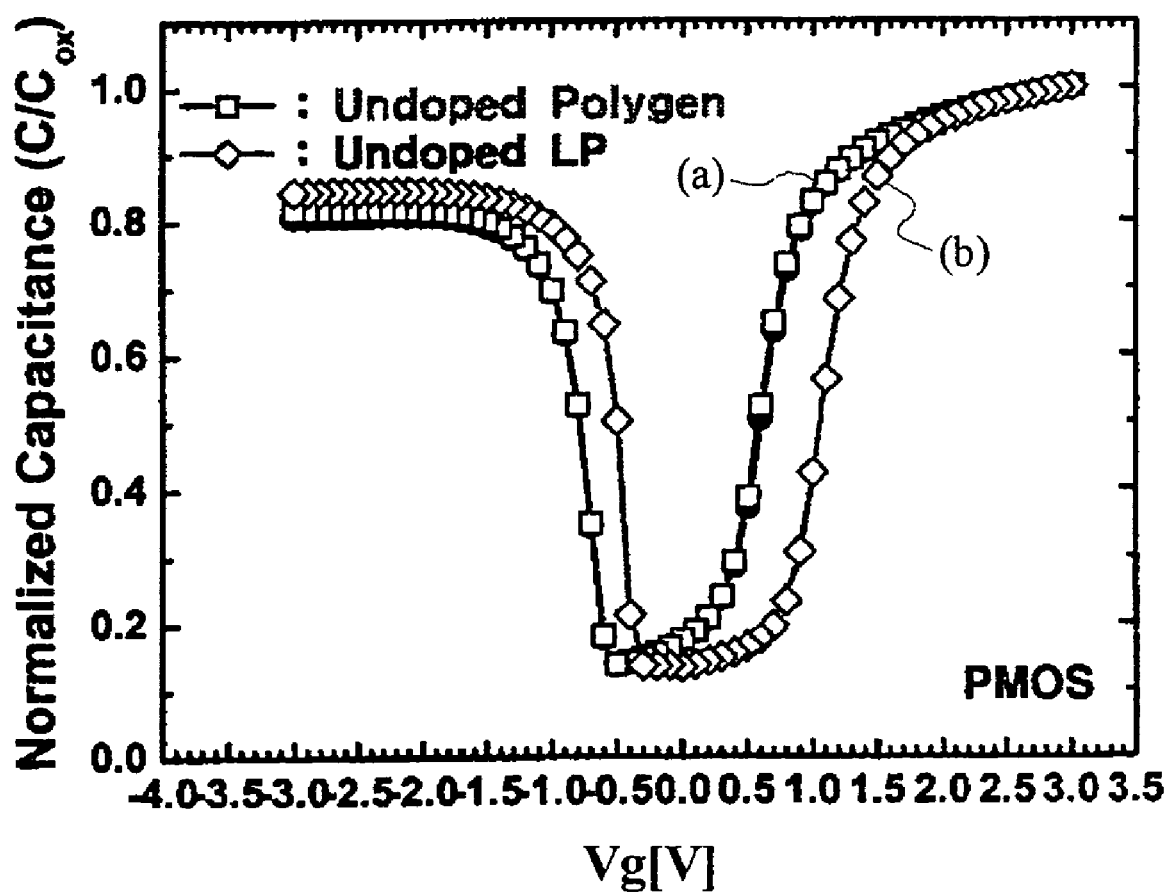
FIG. 4 is a graph comparing C-V characteristics of the polysilicon layers referred to in FIGS. 3a and 3b.

With reference to FIGS. 3a to 4, in a polysilicon referred to FIG. 3a having a grain boundary of a random structure, a C-V curved line (a) based on an N-type channel impurity region indicates a shift to a '−' direction, and a flat band voltage indicates a shift to a '−' direction, and a width of the C-V curved line is small to provide a stable electrical characteristic. However, in a polysilicon referred to FIG. 3b having a grain boundary of a conventional column structure, a C-V curved line (b) indicates a shift to a '+' direction, and a flat band voltage indicates a shift to a '+' direction, and a width of the C-V curved line is largely as compared with the C-V curved line of the invention. Thus, the polysilicon having the grain boundary of the random structure according to the present invention has a prominent C-V characteristic. The polysilicon of FIG. 3a having the grain boundary of the random structure based on the present invention has a random structure by annealing amorphous silicon and forming polysilicon. The polysilicon of FIG. 3b having the grain boundary of the conventional column structure has a column structure by forming polysilicon through a low-pressure chemical vapor deposition. In the measure of the C-V curved line, a common electrode is contacted with the semiconductor substrate 100 doped with the N-type impurity, and an electrode having an applied bias voltage is contacted with the polysilicon layer, then a capacitance of the gate insulation layer 114 is measured by using a voltage difference between the common electrode and the bias voltage. Herewith, a transverse axis of FIG. 4 indicates the bias voltage Vg and a longitudinal axis designates a value normalized for the capacitance value measured in the present invention. Thus, a shift of the capacitance value based on the bias voltage is represented as the C-V curved line according to an impurity density or a defect existing within the gate insulation layer 114. Further, in the polysilicon having the random structure of the invention, the C-V curved lines are provided being almost overlapped, the C-V curved lines being for a case that the P-type impurity is not doped, namely, as an undoped poly, and being for a case that the P-type impurity such as boron or $BF_2$ is doped, namely, as a doped poly. This designates that the P-type impurity did not penetrate into the inside of the gate insulation layer 114. In the meantime, referring to FIG. 5a, a C-V curved line (DPN film) of the gate insulation 114 using the DPN system of the invention is shifted to a '−' direction, and a C-V curved line (Conventional GNox) of the conventional gate insulation layer 114 is shifted to a '+' direction. A width of the C-V curved line based on the invention is small as compared with the C-V curved line of the conventional gate insulation layer 114, and the capacitance value based on the bias voltage is provided stably. That is, the gate insulation layer 114 employing the DPN system of the invention has a more prominent characteristic. Herewith, a transverse axis of FIG. 5a indicates a bias voltage Vg and a longitudinal axis designates a value normalized for the capacitance value measured in the present invention. The gate insulation layer 114 using the DPN system of the invention is obtained through the procedures that the silicon oxide layer is formed more thickly by considering the electrical characteristic and that the P-type impurity is ion implanted into the silicon oxide layer to form the silicon oxide nitride layer on the silicon oxide layer.

Figure 5A:
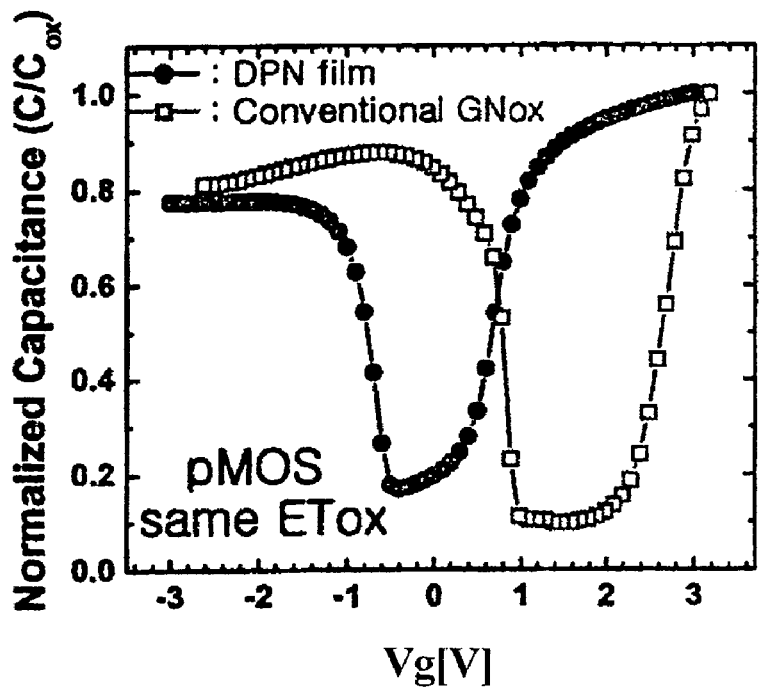
FIG. 5a is a graph showing C-V characteristics of a gate insulation layer employing a DPN system according to an embodiment of the present invention.
Figure 5B:
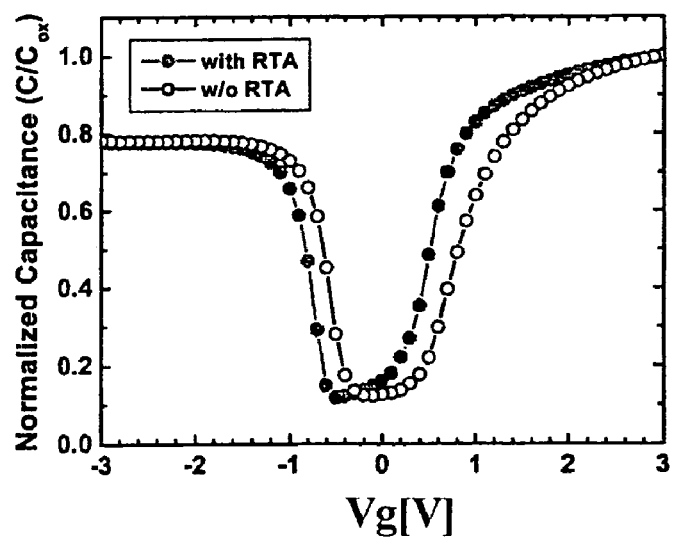
FIG. 5b is a graph showing C-V characteristics of a gate insulation layer based on a rapid thermal annealing (RTA) process.

Referring to FIG. 5b, it indicates that there is a prominent C-V characteristic in such a case that the N-type and P-type impurities are ion implanted into the polysilicon layer formed on the gate insulation layer 114, then the annealing process is performed with a rapid-thermal-annealing (RTA) process, as compared with such a case that the N-type and P-type impurities are ion implanted into the polysilicon layer formed on the gate insulation layer 114, then the annealing process is not performed, namely, without the RTA. Herewith, the transverse axis of FIG. 4 indicates the bias voltage Vg and the longitudinal axis designates the value normalized for the capacitance value measured in the present invention.

Figure 6:
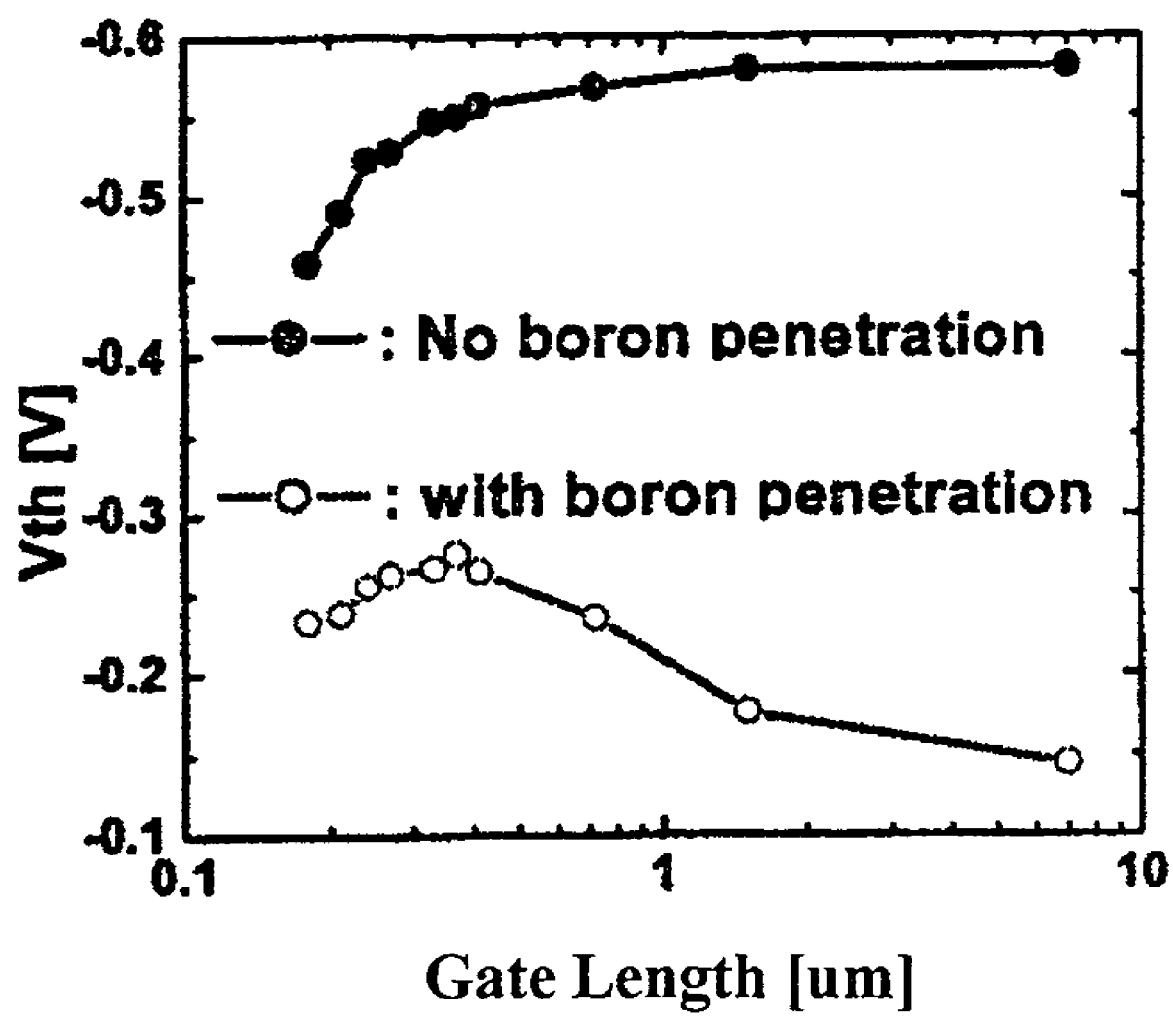
FIG. 6 is a graph comparing threshold voltages in instances of boron penetration with threshold voltages in instances of no boron penetration.

With reference to FIG. 6, in the gate insulation layer 114 of the invention without the boron penetration, a magnitude of a threshold voltage more increases if the gate region G increases. However, in the conventional gate insulation layer 114 with the boron penetration, the magnitude of the threshold voltage is reduced according to the increase of the gate region G. That is, the gate insulation layer 114 of the present invention can control the boron penetration. Herewith, a transverse axis of the FIG. 6 indicates a gate length and a longitudinal axis indicates a magnitude of threshold voltage. At this time, the gate region G of the invention has about 0.3 μm to 10 μm, and represents a shift of about several hundreds of mV regardless of a distance between the gate regions G. If a real space is about 200 nm in a case of separating the gate region G from an edge of the respective gate regions G formed on the NMOS transistor region N and the PMOS transistor region P, it is clarified that there is no characteristic shift. For reference, according to the cited references, a diffusion constant of boron within a silicon compound layer of about 800 Å has about $1.0 \times 10^{-8}$ cm$^2$/s, which is more than 10000 times that of polysilicon, and an impurity absorption from the polysilicon to the silicon compound layer is caused by a high impurity diffusion within the polysilicon layer through a grain boundary diffusion.

Therefore, in the fabricating method of the DRAM semiconductor transistor according to the present invention, the P-type impurity is ion implanted into the polysilicon, then the rapid thermal annealing process is added at about 900° C. to 1000° C. for several seconds to several minutes for the sake of a dopant activation and a poly phase transition and so as to control the boron penetration, thereby enhancing a uniformity of threshold voltage Vth of a PMOS transistor.

Figure 2K:
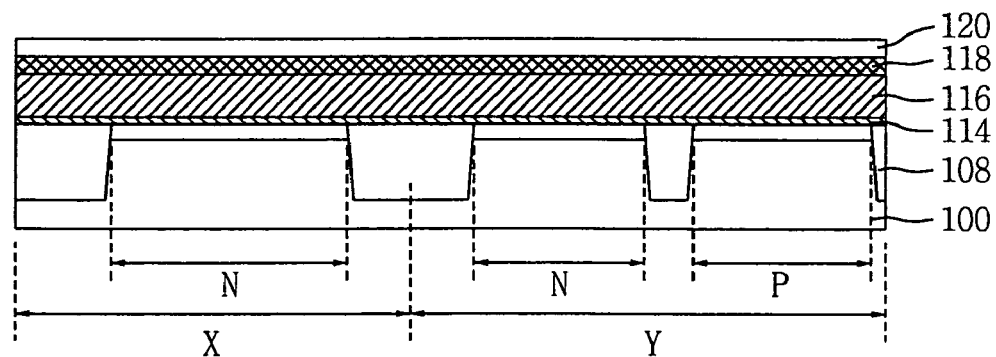

Referring to FIG. 2k, a metal layer 118 is formed with a predetermined thickness, e.g. about 1000 to 1200 Å, on the gate electrode 116, by using $WSi_x$, $TaSi_2$, or $MoSi_2$, etc. and a gate upper insulation layer 120 is formed of silicon nitride on the metal layer 118.

Figure 2L:
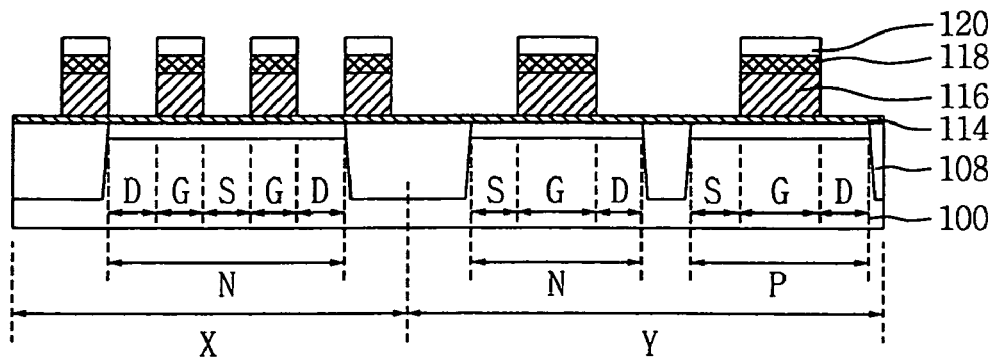

In FIG. 2l, a photoresist (not shown) is deposited on the gate upper insulation layer 120. Then, the gate upper insulation layer 120, the metal layer 118 and the gate electrode 116 are partially removed (as shown) to expose a portion of the gate insulation layer 114 by using the photoresist as an etch mask. Though not shown in the drawing, in forming an inverter (an AND gate and NOR gate circuit where the gate electrode 116 formed in the circuit region Y is grounded) the gate electrode 116 on the device isolation film 108 between the NMOS transistor region N and the PMOS transistor region P is removed to isolate the aforementioned electrodes. Further, separating the gate electrode 116 of the NMOS transistor from the gate electrode 116 of the PMOS transistor at this time helps prevents an inter-diffusion between N-type and P-type impurities in the metal layer through a subsequent annealing process. The aforementioned inter-diffusion is undesirable because it will lower the performance of the device. After that, the photoresist is removed.

Figure 2M:
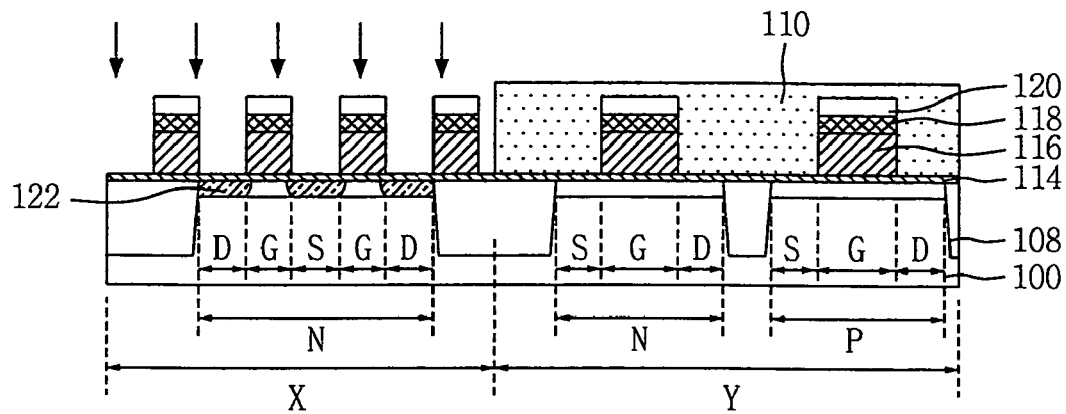

In FIG. 2m, a photoresist 110 is deposited on an entire face of the semiconductor substrate 100, and the photoresist 110 is partially removed to expose the cell region X. An N-type impurity such as phosphorus or As of a low dose, e.g. $1.0 \times 10^{13}$ atoms/cm$^3$, is ion-implanted into the S/D exposed by using the photoresist 110 and the gate upper insulation layer 120 as an ion implantation mask to form a first impurity region 122 of a low density, e.g. about $1.0 \times 10^{17}$ atoms/cm$^3$. Then the photoresist 110 is removed. Though not shown in the drawing, a second channel stopper may be formed with the P-type impurity before forming the first impurity region 122 to advantageously produce a tilt at a portion of the S/D and to invade a portion of the gate region G. This ion implantation process of the P-type impurity is performed at an energy of about 50 KeV so that the second channel stopper is formed at a depth of about 2000 Å.

Figure 2N:
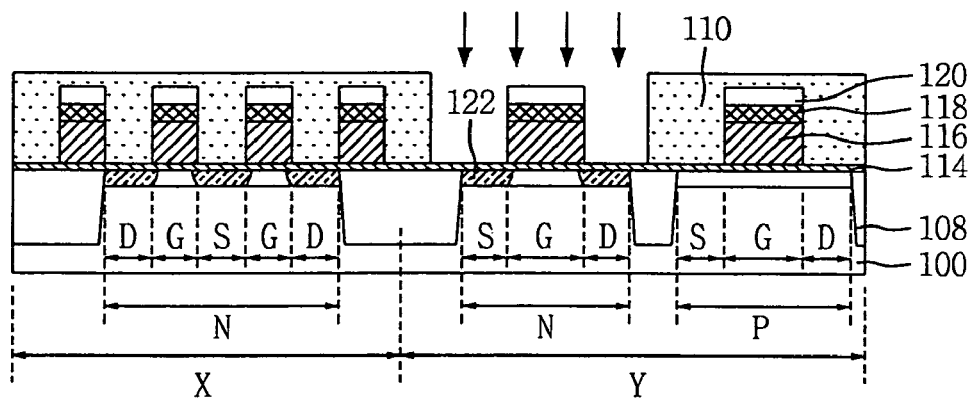

With reference to FIG. 2n, the photoresist 110 is deposited on an entire face of the semiconductor substrate 100, and the photoresist 110 is partially removed to expose the NMOS transistor region N of the circuit region Y. An N-type impurity such as phosphorus or As of a low dose, e.g. $1.0 \times 10^{13}$ atoms/cm$^3$, is ion-implanted into the S/D by using the photoresist 110 and the gate upper insulation layer 120 as an ion implantation mask to form the first impurity region 122 of a low density, e.g. about $1.0 \times 10^{17}$ atoms/cm$^3$. Then the photoresist 110 is removed. Though not shown in the drawing, the second channel stopper may be formed with the P-type impurity before forming the first impurity region 122, to advantageously produce a tilt at a portion of the S/D and to invade a portion of the gate region G. This ion implantation process of the P-type impurity is performed at an energy of about 50 KeV so that the second channel stopper is formed at a depth of about 2000 Å.

Figure 2O:
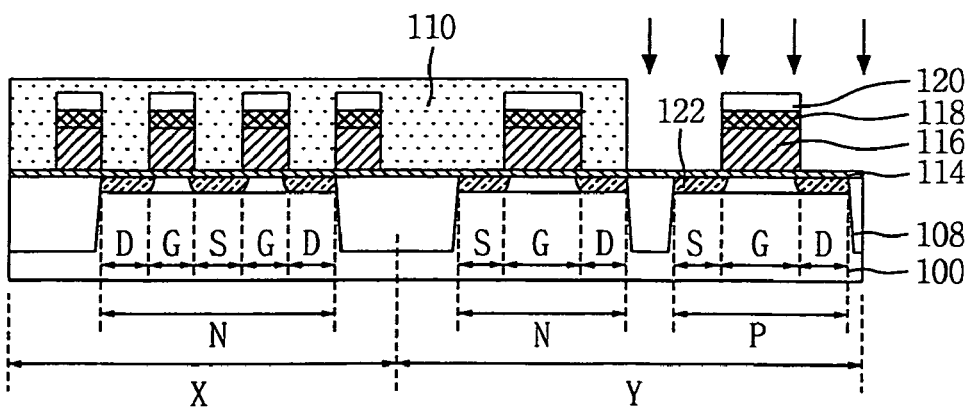

Referring to FIG. 2o, the photoresist 110 is deposited on an entire face of the semiconductor substrate 100, and the photoresist 110 is partially removed to expose the PMOS transistor region P of the circuit region Y. A P-type impurity such as boron or BF$_2$ of a low dose, e.g. about $1.0 \times 10^{13}$ atoms/cm$^3$, is ion-implanted into the S/D exposed by using the photoresist 110 and the gate upper insulation layer 120 as an ion implantation mask to form the first impurity region 122 of a low density, e.g. about $1.0 \times 10^{17}$ atoms/cm$^3$. Then the photoresist 110 is removed. Subsequently, an annealing process at high temperature, e.g. about 800° C., is performed to reduce lattice defects of the silicon semiconductor substrate 100 that may be generated by the ion implantation. Though not shown in the drawing, the second channel stopper may be formed with the N-type impurity before forming the first impurity region 122 to advantageously produce a tilt at a portion of the S/D and to invade a portion of the gate region G. This ion implantation process of the N-type impurity is performed at an energy of about 50 KeV so that the second channel stopper is formed at a depth of about 2000 Å.

Figure 2P:
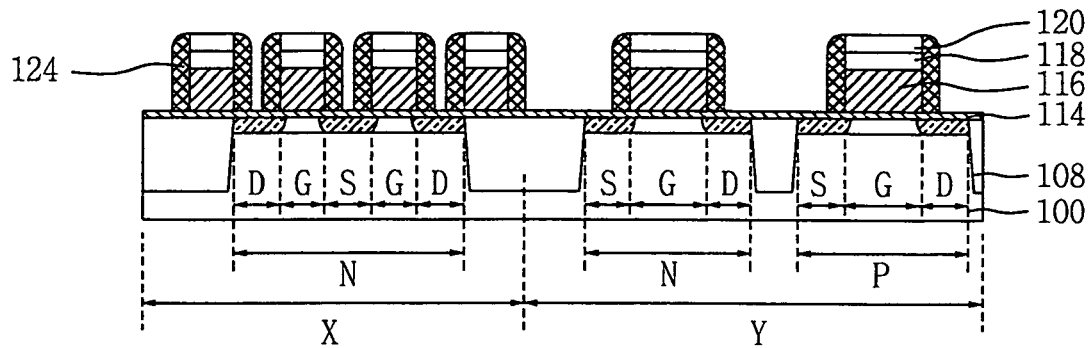

With reference to FIG. 2p, a silicon nitride layer (not shown) is formed with a predetermined thickness on the substrate, and a photoresist (not shown) is deposited on the silicon nitride layer. The photoresist is partially removed to form a spacer 124 on a sidewall of the gate electrode 116.

Figure 2Q:
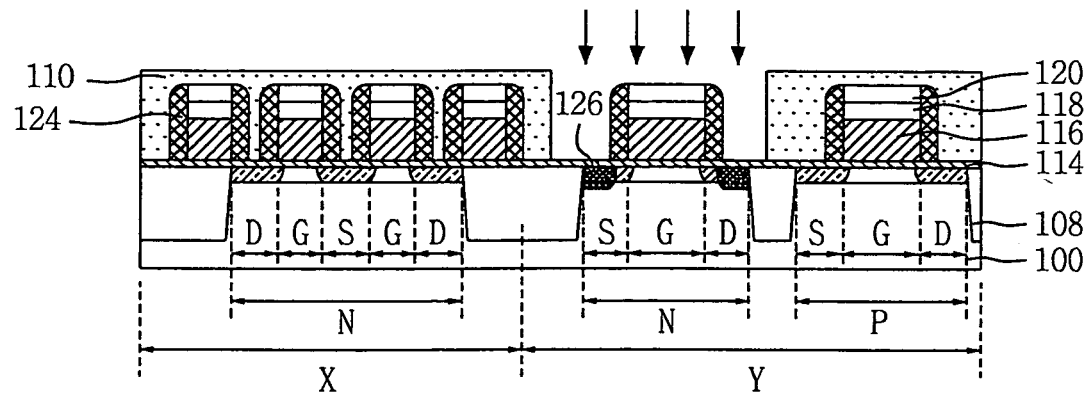

In FIG. 2q, the photoresist 110 is deposited on an entire face of the substrate, and the photoresist 110 is patterned to expose the NMOS transistor region N of the circuit region Y. An N-type impurity of a high dose, e.g. about $1.2 \times 10^{16}$ atoms/cm$^3$, is ion-implanted by using the photoresist 110, the gate upper insulation layer 120, and the spacer 124 as an ion implantation mask to form a second impurity region 126 of a high density, e.g. about $2.0 \times 10^{20}$ atoms/cm$^3$. Then the photoresist 110 is removed. This ion implantation process of the N-type impurity is performed at energy of about 50 KeV so that the second impurity region 126 is formed with a predetermined depth, e.g. about 1000 to 2000 Å.

Figure 2R:
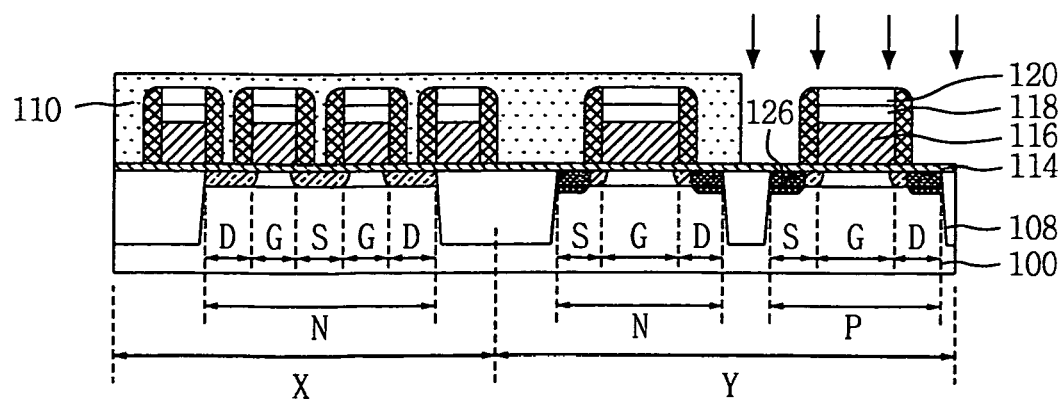

Referring to FIG. 2r, the photoresist 110 is deposited on an entire face of the substrate, and the photoresist 110 is partially removed to expose the PMOS transistor region P of the circuit region Y. A P-type impurity of a high dose, e.g. about $1.2 \times 10^{20}$ atoms/cm$^3$, is ion-implanted by using the photoresist 110, the gate upper insulation layer 120, and the spacer 124 as an ion implantation mask to form the second impurity region 126 of a high density, e.g. about $2.0 \times 10^{20}$ atoms/cm$^3$. Then the photoresist 110 is removed. This ion implantation process of the P-type impurity is performed at energy of about 50 KeV so that the second impurity region 126 is formed at a depth of about 2000 Å.

Figure 2S:
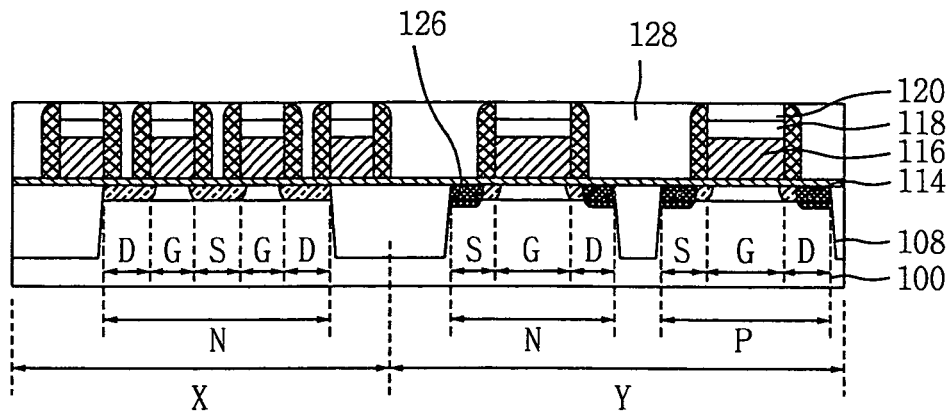

With reference to FIG. 2s, an interlayer insulation layer 128 is formed of silicon oxide on the substrate and is flattened through CMP or etch-back to expose the gate upper insulation layer 120 and a portion of the spacer 124.

Figure 2T:
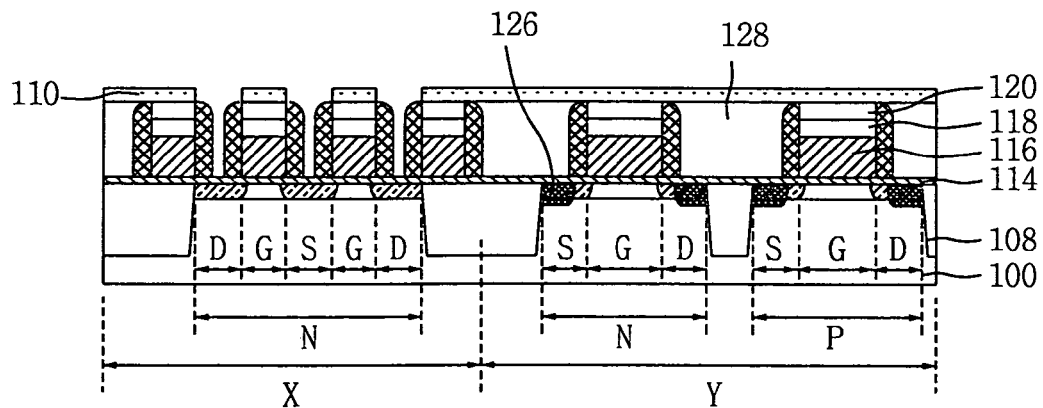

In FIG. 2t, the photoresist 110 is deposited on the interlayer insulation layer 128, and the photoresist 110 and the interlayer insulation layer 128 are partially removed to expose the gate insulation layer 114 above the S/D of the cell region X. Next, the photoresist 110 is removed.

Figure 2U:
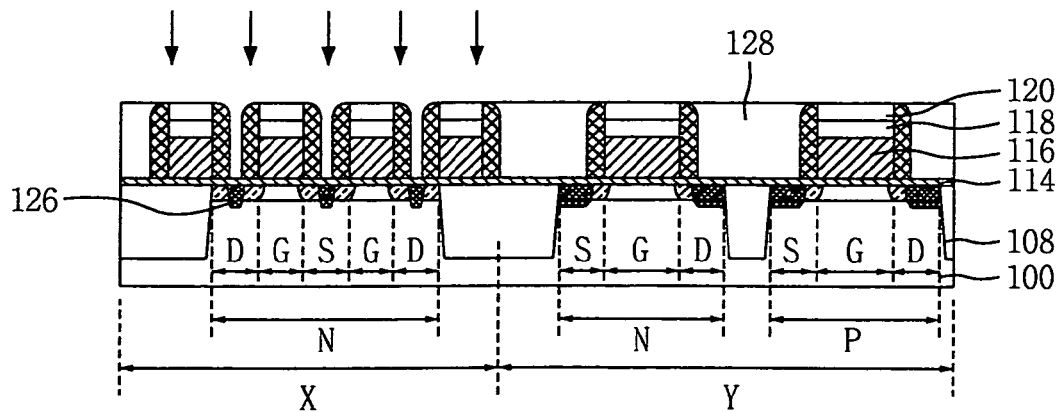

In FIG. 2u, an N-type impurity of a high dose, e.g. about $1.2 \times 10^{20}$ atoms/cm$^3$, is ion-implanted by using the interlayer insulation layer 128, the gate electrode 116, and the spacer 124 as an ion implantation mask to form the second impurity region 126 of a high density, e.g. about $2.0 \times 10^{20}$ atoms/cm$^3$. Then, an annealing process of a high temperature, e.g. about 800° C., is performed.

Figure 2V:
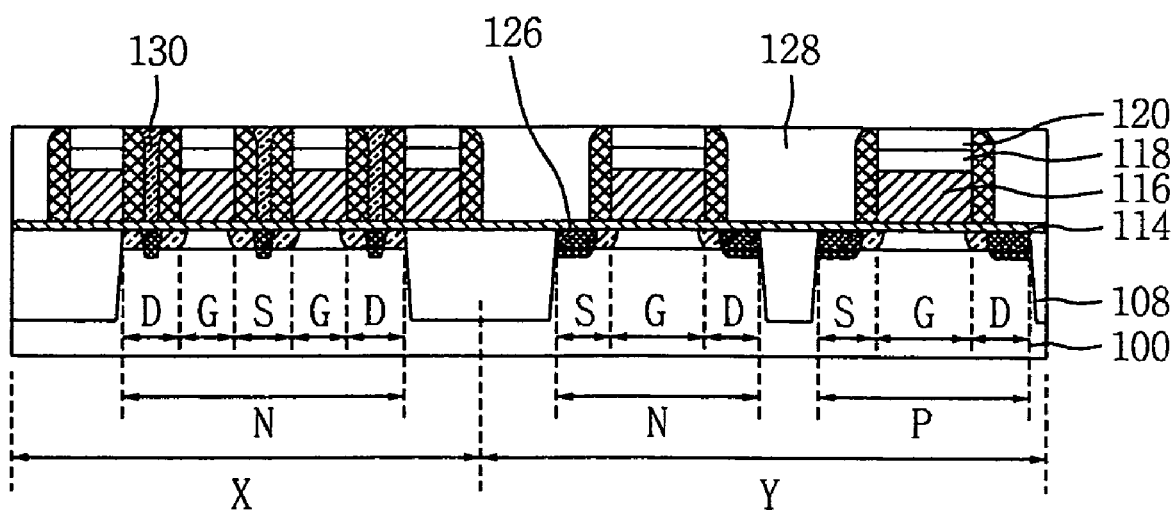

Referring to FIG. 2v, the gate insulation layer 114 is removed (not shown) from the S/D of the cell region X. A pad polysilicon layer 130 is formed of a polysilicon layer containing a conductive impurity on the semiconductor substrate 100, and is flattened through CMP or etch-back to expose the gate upper insulation layer 120 and a portion of the spacer 124. Then, an annealing process of a high temperature, e.g. about 830° C., is performed thus reducing possible defects on the surface of the semiconductor substrate 10 of the S/D below the pad polysilicon layer 130.

Though not shown in the drawing, an interlayer insulation layer is formed on the pad polysilicon layer 130. Further, the interlayer insulation layer is removed above the source region S to form a first contact hole, and a bit line contact is formed to be electrically connected to the pad polysilicon layer 130 through the first contact hole. Then, another interlayer insulation layer is formed on the substrate, and both interlayer insulation layers are removed from above the drain region to form a second contact hole. Then a storage electrode electrically connected to the pad polysilicon layer 130 through the second contact hole, a dielectric layer, and a plate electrode are sequentially formed, thereby completing a capacitor of a memory cell.

As was described above, in the method of fabricating a transistor according to the present invention, a gate insulation layer formed of a silicon oxide layer and a silicon oxide nitride layer is formed, and a P-type impurity is ion implanted into a polysilicon layer that is formed on the gate insulation layer. By doing so, a penetration of the P-type impurity into the gate insulation layer is prevented, thus increasing the performance of the device.

In addition, in forming a gate electrode a polysilicon layer is formed through CVD using a reactive gas that contains an N-type impurity. Thus, the process of separately implanting an N-type impurity into parts of the polysilicon layer can be avoided. A P-type impurity is then implanted into the polysilicon layer of a PMOS transistor region. Therefore, the number of the ion-implantation processes can be reduced, increasing productivity.

It will be apparent to those skilled in the art that modifications and variations can be made in the present invention without deviating from the spirit or scope of the invention. Thus, it is intended that the present invention cover any such modifications and variations of this invention provided they come within the scope of the appended claims and their equivalents. Accordingly, these and other changes and modifications are seen to be within the true spirit and scope of the invention as defined by the appended claims.

What is claimed is:

1. A method of fabricating a transistor of a DRAM (dynamic random access memory) semiconductor device, comprising:

forming a device isolation film on a semiconductor substrate;

ion-implanting a channel adjusting impurity into an active region of a cell region and a circuit region, both defined by the device isolation film, to form respective channel impurity regions;

forming a gate insulation layer on the semiconductor substrate by using a silicon oxide layer and a silicon oxide nitride layer, wherein the silicon oxide nitride layer is formed through an atomic-layer-deposition (ALD) system or a decoupled plasma nitridation (DPN) system;

forming a first impurity-doped polysilicon layer on the gate insulation layer, and selectively ion-implanting a second impurity of a different type than the first impurity into the polysilicon layer to form a gate electrode comprising an N-type impurity-doped region adjacent to a P-type impurity region;

forming a conductive metal layer and a gate upper insulation layer on the gate electrode, and removing the gate upper insulation layer, the conductive metal layer and the gate electrode from above a source/drain region, to form a gate stack in a gate region; and forming a first impurity region in the source/drain region by using the gate upper insulation layer as an ion implantation mask, forming a spacer on a sidewall of the gate electrode, and forming a second impurity region included within the first impurity region by using the spacer and the gate upper insulation layer as an ion implantation mask.

2. The method as claimed in 1, wherein the formation of the device isolation film comprises:

sequentially forming a pad oxide layer, a molding polysilicon layer and a hard mask layer on the semiconductor substrate;

depositing a photoresist on the hard mask layer, and patterning the photoresist to expose a portion of the hard mask layer;

partially etching the molding polysilicon layer, the pad oxide layer and the semiconductor substrate by using the photoresist as an etch mask to form a trench; and forming the device isolation film within the trench by using a thermal oxide process.

3. The method as claimed in 1, wherein an NMOS transistor region is obtained by ion-implanting a second impurity into the channel impurity region.

4. The method as claimed in 3, wherein the second impurity is boron or $BF_2$.

5. The method as claimed in 1, wherein a PMOS transistor region is obtained by ion-implanting a second impurity into the channel impurity region.

6. The method as claimed in 5, wherein the second impurity is phosphorus or As.

7. The method as claimed in 1, wherein the channel impurity region comprises a channel adjusting impurity with a density of $1 \times 10^{13}$ atoms/cm$^3$.

8. The method as claimed in 1, wherein the gate insulation layer is formed with a thickness of 25 to 55 Å.

9. The method as claimed in 1, wherein the silicon oxide layer in the gate insulation layer is formed using a thermal oxide process.

10. The method as claimed in 1, wherein the gate insulation layer is formed in a furnace, an ISSG (in-situ steam generation) process chamber, or an RTO (rapid thermal oxidation) process chamber.

11. The method as claimed in 1, wherein the silicon oxide nitride layer in the gate insulation layer is formed under an atmosphere of NO, $NO_2$, or $NH_3$.

12. The method as claimed in 1, wherein the ALD system includes forming the silicon oxide nitride layer at temperature of 550 to 650° C.

13. The method as claimed in 1, wherein the ALD system is performed by forming the silicon oxide nitride layer on the silicon oxide layer.

14. The method as claimed in 13, wherein the silicon oxide layer is formed with a thickness of about 30 to 40 Å, and the silicon oxide nitride layer is formed with a thickness of about 10 to 25 Å.

15. The method as claimed in 13, wherein the silicon oxide nitride layer is formed by using thermally nitrided oxide or reoxidized nitrided oxide.

16. The method as claimed in 1, wherein the ALD system is performed by alternately supplying DCS ($SiH_2Cl_2$) and $NH_3$ gas into a process chamber.

17. The method as claimed in 16, wherein the DCS ($SiH_2Cl_2$) and $NH_3$ gases are alternatively supplied into the process chamber at a supply cycle of about every several seconds to about every several tens of seconds.

18. The method as claimed in 16, wherein a thickness of a sub-layer of the silicon oxide nitride layer is about 1.0 to 1.4 Å depending on the length of the supply cycle.

19. The method as claimed in 1, wherein the DPN system comprises implanting a nitrogen ion into the silicon oxide layer.

20. The method as claimed in 1, wherein the DPN system further comprises forming the silicon oxide nitride layer below 100° C.

21. The method as claimed in 1, wherein the DPN system is performed for about 50 to 150 seconds.

22. The method as claimed in 1, wherein the DPN system is performed under a pressure of about 7 to 11 mTorr in a plasma apparatus.

23. The method as claimed in 1, wherein the DPN system is performed with a power source of about 500 or 900 W.

24. The method as claimed in 1, wherein the DPN system is performed by supplying NO, $NO_2$, or $NH_3$ gas into a plasma apparatus for about 50 to 110 seconds to form the silicon oxide nitride layer.

25. The method as claimed in 1, wherein the silicon oxide nitride layer formed through the use of the DPN system is post annealed.

26. The method as claimed in 25, wherein the post annealing process is performed at about 850 to 950° C.

27. The method as claimed in 25, wherein the post annealing process is performed for about 30 seconds.

28. The method as claimed in 1, wherein the first impurity is phosphorous or As.

29. The method as claimed in 1, wherein the density of the first impurity is about $2.0 \times 10^{20}$ atoms/$cm^3$.

30. The method as claimed in 1, wherein the formation of the gate electrode further comprises:
    forming an amorphous silicon layer comprising the first impurity on the gate insulation layer; and
    annealing the amorphous silicon layer at a predetermined temperature to form polysilicon having a random structure.

31. The method as claimed in 30, wherein the annealing process is performed at about 520 to 550° C.

32. The method as claimed in 30, wherein the annealing process is performed for about several tens of minutes.

33. The method as claimed in 32, wherein the second impurity is ion implanted with a dose of about $1.2 \times 10^{16}$ atoms/$cm^3$.

34. The method as claimed in 1, wherein the second impurity is boron or $BF_2$.

35. The method as claimed in 34, wherein the boron is ion implanted with an energy of 10 KeV.

36. The method as claimed in 34, wherein the $BF_2$ is ion implanted with an energy of 3 KeV.

37. The method as claimed in 1, further comprising annealing the semiconductor substrate after the ion implantation.

38. The method as claimed in 37, wherein the annealing process comprises rapid thermal annealing (RTA).

39. The method as claimed in 38, wherein the RTA is performed at about 900 to 1000° C.

40. The method as claimed in 38, wherein the RTA is performed for several tens of seconds.

41. The method as claimed in 1, wherein the gate electrode is formed with a thickness of about 800 Å.

42. The method as claimed in 1, wherein the conductive metal layer contains at least $WSi_x$, $TaSi_2$ or $MoSi_2$.

43. The method as claimed in 1, wherein the spacer is formed of silicon nitride.

44. The method as claimed in 1, wherein the formation of the second impurity region comprises:
    forming a first part of the second impurity region in the source/drain region of the circuit region;
    forming an interlayer insulation layer on an entire face of the semiconductor substrate and flattening the interlayer insulation layer; and
    removing the interlayer insulation layer formed in the cell region and forming a second part of the second impurity region in the source/drain region of the cell region.

45. The method as claimed in 44, wherein the interlayer insulation layer is formed of a silicon oxide.

46. The method as claimed in 44, wherein the flattening comprises chemical mechanical polishing (CMP) or etchback.

47. A method of fabricating a transistor of a DRAM semiconductor device, comprising:
    forming a device isolation film on a semiconductor substrate;
    ion-implanting a channel adjusting impurity into an active region of a cell region and a circuit region, both defined by the device isolation film, to form respective channel impurity regions;
    forming a silicon oxide layer on the semiconductor substrate and then forming a silicon oxide nitride layer on the silicon oxide layer to form a gate insulation layer or then implanting a nitrogen component into the silicon oxide layer to form a gate insulation layer, wherein the silicon oxide nitride layer is formed through an atomic-layer-deposition (ALD) system or a decoupled plasma nitridation (DPN) system;
    forming an N-type impurity-doped polysilicon layer on the gate insulation layer, and forming a gate electrode by selectively ion-implanting a P-type impurity into the polysilicon layer formed in a PMOS transistor region of the circuit region;
    forming a conductive metal layer and a gate upper insulation layer on the semiconductor substrate on which the gate electrode is formed;
    removing the conductive metal layer and the gate electrode from above a source/drain region to form a gate stack in a gate region of an NMOS transistor region and the PMOS transistor region; and
    forming a first impurity region in the source/drain region by using the upper insulation layer as an ion implantation mask, forming a spacer on a sidewall of the gate electrode, and forming a second impurity region within first impurity region by using the spacer and the gate upper insulation layer as an ion implantation mask.

48. A method of forming a gate electrode:
    forming a gate insulation layer by using a silicon oxide layer and a silicon oxide nitride layer, wherein the silicon oxide nitride layer is formed through an atomic-layer-deposition (ALD) system or a decoupled plasma nitridation (DPN) system;
    forming a polysilicon layer doped with a first impurity on the gate insulation layer;
    and selectively ion-implanting a second impurity of a different type than the first impurity into the polysilicon layer to form a P-type impurity-doped region adjacent to an N-type impurity region.

49. The method as claimed in 48, wherein the density of the first impurity is about $2.0 \times 10^{20}$ atoms/$cm^3$.

50. The method as claimed in 48, wherein the formation of the gate electrode further comprises:
    forming an amorphous silicon layer comprising the first impurity on the gate insulation layer; and
    annealing the amorphous silicon layer at a predetermined temperature to form polysilicon having a random structure.

51. The method as claimed in 50, wherein the annealing process is performed at about 520 to 550° C.

52. The method as claimed in 50, wherein the annealing process is performed for about several tens of minutes.

53. The method as claimed in 52, wherein the second impurity is ion implanted with a dose of about $1.2 \times 10^{16}$ atoms/$cm^3$.

54. The method as claimed in 48, wherein the second impurity is boron or $BF_2$.

55. The method as claimed in 54, wherein the boron is ion implanted with energy of 10 KeV.

56. The method as claimed in 54, wherein the $BF_2$ is ion implanted with energy of 3 KeV.

57. The method as claimed in 48, further comprising annealing after the ion implantation.

58. The method as claimed in 57, wherein the annealing process employs a rapid thermal annealing (RTA).

59. The method as claimed in 58, wherein the RTA is performed at about 900 to 1000° C.

60. The method as claimed in 58, wherein the RTA is performed for several tens of seconds.

61. The method as claimed in 48, wherein the gate electrode is formed with a thickness of about 800 Å.

* * * * *